(12) United States Patent
Sakioka et al.

(10) Patent No.: US 10,542,229 B2
(45) Date of Patent: Jan. 21, 2020

(54) SOLID-STATE IMAGING DEVICE, SIGNAL PROCESSING METHOD THEREFOR, AND ELECTRONIC APPARATUS FOR ENABLING SENSITIVITY CORRECTION

(71) Applicant: SONY CORPORATION, Tokyo (JP)

(72) Inventors: Youji Sakioka, Kanagawa (JP);
Masayuki Tachi, Kanagawa (JP);
Hisashi Nishimaki, Kanagawa (JP);
Taishin Yoshida, Tokyo (JP)

(73) Assignee: Sony Corporation, Tokyo (JP)

( * ) Notice: Subject to any disclaimer, the term of this patent is extended or adjusted under 35 U.S.C. 154(b) by 23 days.

(21) Appl. No.: 15/873,580

(22) Filed: Jan. 17, 2018

(65) Prior Publication Data

US 2018/0160067 A1    Jun. 7, 2018

Related U.S. Application Data

(63) Continuation of application No. 15/029,763, filed as application No. PCT/JP2015/073463 on Aug. 21, 2015, now Pat. No. 9,918,031.

(30) Foreign Application Priority Data

Sep. 1, 2014    (JP) ................. 2014-177171

(51) Int. Cl.
*H04N 5/3745*    (2011.01)
*H01L 27/146*    (2006.01)
(Continued)

(52) U.S. Cl.
CPC ....... *H04N 5/3745* (2013.01); *H01L 27/1464* (2013.01); *H01L 27/14607* (2013.01);
(Continued)

(58) Field of Classification Search
CPC .. H04N 5/3745; H04N 5/3572; H04N 5/3696; H01L 27/14607; H01L 27/14621;
(Continued)

(56) References Cited

U.S. PATENT DOCUMENTS

| 2011/0279727 A1* | 11/2011 | Kusaka | ............ H01L 27/14621 |
| | | | 348/340 |
| 2014/0104465 A1* | 4/2014 | Yamashita | ............ H04N 9/045 |
| | | | 348/280 |

FOREIGN PATENT DOCUMENTS

| CN | 103597821 | 2/2014 |
| JP | 2002-131623 | 5/2002 |

(Continued)

OTHER PUBLICATIONS

Official Action p(no English translation) for Japanese Patent Application No. 2014-177171 dated Mar. 1, 2018, 7 pages.
(Continued)

*Primary Examiner* — Nicholas G Giles
(74) *Attorney, Agent, or Firm* — Sheridan Ross P.C.

(57) ABSTRACT

The present disclosure relates to a solid-state imaging device, a signal processing method therefor, and an electronic apparatus enabling sensitivity correction in which a sensitivity difference between solid-state imaging devices is suppressed.
The solid-state imaging device includes a pixel unit in which one microlens is formed for a plurality of pixels in a manner such that a boundary of the microlens coincides with boundaries of the pixels. The correction circuit corrects a sensitivity difference between the pixels inside the pixel unit based on a correction coefficient. The present disclosure is applicable to, for example, a solid-state imaging device and the like.

20 Claims, 24 Drawing Sheets

(51) Int. Cl.
*H04N 5/357* (2011.01)
*H04N 5/369* (2011.01)

(52) U.S. Cl.
CPC .. *H01L 27/14621* (2013.01); *H01L 27/14627* (2013.01); *H01L 27/14641* (2013.01); *H01L 27/14645* (2013.01); *H04N 5/3572* (2013.01); *H04N 5/3696* (2013.01)

(58) Field of Classification Search
CPC ........... H01L 27/14627; H01L 27/1464; H01L 27/14641; H01L 27/14645
See application file for complete search history.

(56) References Cited

FOREIGN PATENT DOCUMENTS

| | | |
|---|---|---|
| JP | 2007-189312 | 7/2007 |
| WO | WO 2013/147199 | 10/2013 |
| WO | WO 2014/050875 | 4/2014 |
| WO | WO 2014/080674 | 5/2014 |

OTHER PUBLICATIONS

Official Action (with English translation) for Chinese Patent Application No. 201580001868.6, dated Apr. 3, 2019, 16 pages.

* cited by examiner

SOLID-STATE IMAGING DEVICE, SIGNAL PROCESSING METHOD THEREFOR, AND ELECTRONIC APPARATUS FOR ENABLING SENSITIVITY CORRECTION

CROSS REFERENCE TO RELATED APPLICATIONS

This application is a continuation of U.S. patent application Ser. No. 15/029,763, filed Apr. 15, 2016, which is a national stage application under 35 U.S.C. 371 and claims the benefit of PCT Application No. PCT/JP2015/073463 having an international filing date of 21 Aug. 2015, which designated the United States, which PCT application claimed the benefit of Japanese Patent Application No. 2014-177171 filed 1 Sep. 2014, the disclosures of which are incorporated herein by reference in their entirety.

TECHNICAL FIELD

The present disclosure relates to a solid-state imaging device, a signal processing method therefor, and an electronic apparatus, and particularly relates to a solid-state imaging device, a signal processing method therefor, and an electronic apparatus enabling sensitivity correction in which a sensitivity difference between solid-state imaging devices is suppressed.

BACKGROUND ART

In a solid-state imaging device such as a CMOS image sensor, there is a disclosed example in which a phase difference in an object image is detected by dividing a photodiode that partly shields light of a microlens or receives a light flux collected by a microlens, and the detection result is used for focus detection and the like (Patent Documents 1 and 2, for example).

In this kind of the solid-state imaging device having a function of phase difference detection, positional shift relative to the photodiode tends to occur in the microlens and a shielding portion due to a manufacture process thereof, and such positional shift may cause a sensitivity difference between a pixel pair in which a phase difference is detected. Since an output difference between a pixel pair is used in detecting a phase difference, the sensitivity difference caused by an error (positional shift) during manufacture may become a factor to degrade accuracy of the phase difference. Since such a manufacture error is varied by a lot and the like during production, for example, a level of the sensitivity difference and a direction of magnitude thereof are different between solid-state imaging devices.

Considering this, there is a disclosed solid-state imaging device that corrects a sensitivity difference caused by a manufacture error (Patent Document 3, for example). According to an embodiment of Patent Document 3, in a pixel pair where a sensitivity difference is caused, output adjustment is performed for a pixel having higher output by multiplying a pixel having lower output by a correction coefficient.

CITATION LIST

Patent Document

Patent Document 1: Japanese Patent Application Laid-Open No. 2001-250931
Patent Document 2: Japanese Patent Application Laid-Open No. 2005-303409
Patent Document 3: Japanese Patent Application Laid-Open No. 2010-237401

SUMMARY OF THE INVENTION

Problems to be Solved by the Invention

However, according to a correction method disclosed in Patent Document 3, a sensitivity difference between a pixel pair is resolved by correction, but there is no reference for a value to be corrected by a correction coefficient. Therefore, a pixel output value after correction may be varied by a degree of variation of solid-state imaging devices. For example, even when the solid-state imaging devices having the same model number are used, values output from the solid-state imaging devices under a same light amount become different in the respective solid-state imaging devices. As a result, detection accuracy of phase difference may be varied by each chip, and brightness of an image may be varied by each chip when pixel output of the phase difference is utilized for preview and the like at the time of focusing.

The present disclosure is made in view of the above-described situation, and directed to enabling sensitivity correction in which a sensitivity difference between solid-state imaging devices is suppressed.

Solutions to Problems

A solid-state imaging device according to a first aspect of the present disclosure, includes: a pixel unit in which one microlens is formed for a plurality of pixels in a manner such that a boundary of the microlens coincides with boundaries of the pixels; and a correction circuit adapted to correct a sensitivity difference between pixels inside the pixel unit based on a correction coefficient.

In a signal processing method for a solid-state imaging device according to a second aspect of the present disclosure, the solid-state imaging device includes a pixel unit in which one microlens is formed for a plurality of pixels in a manner such that a boundary of the microlens coincides with boundaries of the pixels, and a correction circuit of the solid-state imaging device corrects a sensitivity difference between pixels inside the pixel unit based on a correction coefficient.

An electronic apparatus according to a third aspect of the present disclosure is provided with a solid-state imaging device that includes: a pixel unit in which one microlens is formed for a plurality of pixels in a manner such that a boundary of the microlens coincides with boundaries of the pixels; and a correction circuit adapted to correct a sensitivity difference between pixels inside the pixel unit based on a correction coefficient.

According to the first to third aspects of the present disclosure, the above-described one microlens is formed for the plurality of pixels in the pixel unit of the solid-state imaging device in a manner such that the boundary of the microlens coincides with the boundaries of the pixels. In the correction circuit, the sensitivity difference between the pixels inside the pixel unit is corrected based on the correction coefficient.

The solid-state imaging device and the electronic apparatus may be independent devices or modules incorporated in another device.

Effects of the Invention

According to first to third aspects of the present disclosure, it is possible to perform sensitivity correction in which a sensitivity difference between solid-state imaging devices is suppressed.

Note that the effect recited herein is not necessarily limited thereto and may be any one of those recited in the present disclosure.

MODE FOR CARRYING OUT THE INVENTION

A mode for carrying out the present disclosure (hereinafter referred to as embodiment) will be described below. Note that the description will be provided in the following order.

1. First Embodiment (exemplary structure of a solid-state imaging device including a correction circuit and a memory)
2. Second Embodiment (exemplary structure of a solid-state imaging device including a correction circuit)
3. Third Embodiment (exemplary structure of a camera module including a correction circuit and a memory)
4. Exemplary Application to Electronic Apparatus

1. First Embodiment

<Exemplary Schematic Structure of Solid-State Imaging Device>

Figure 1:
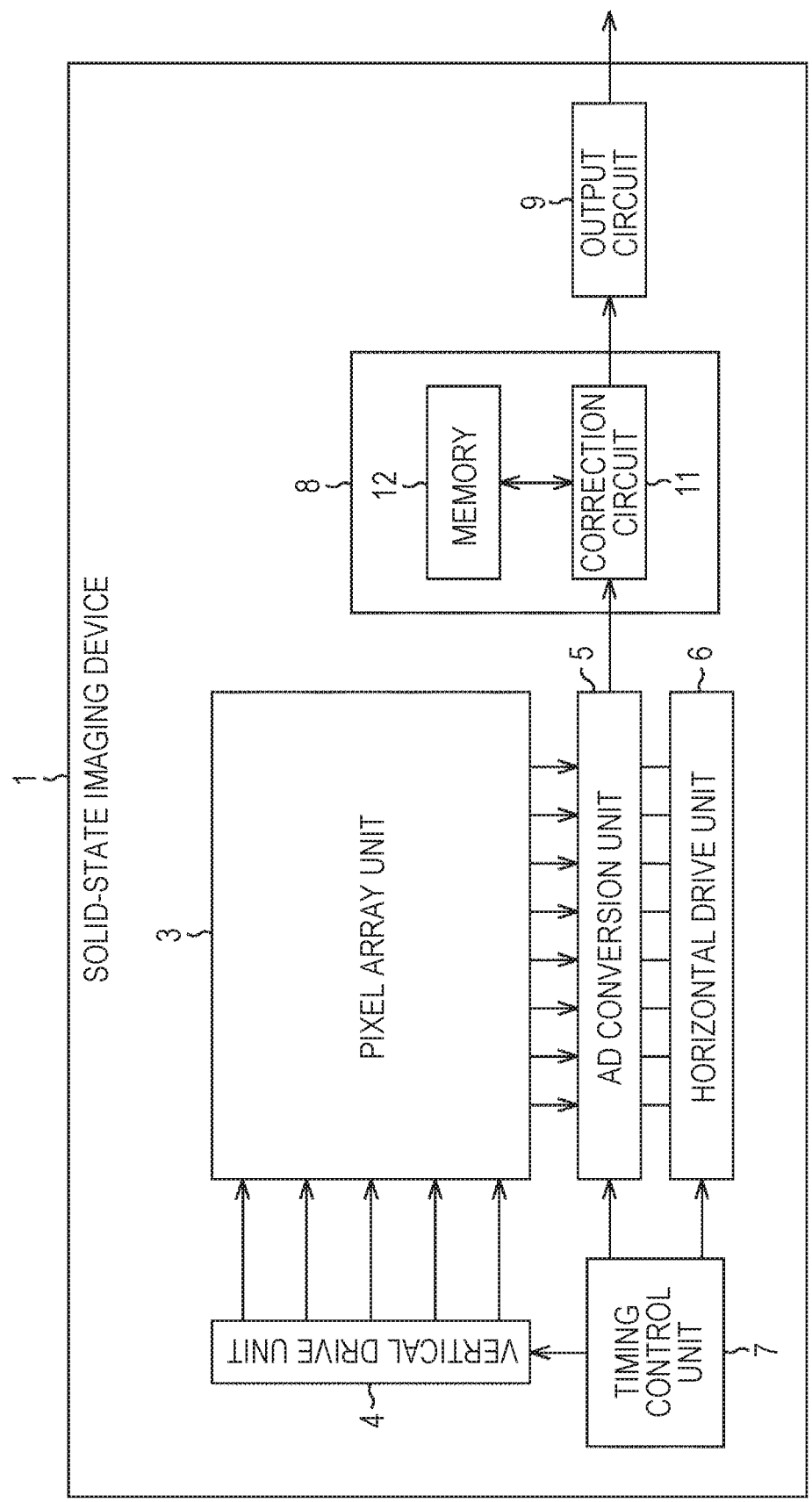
FIG. 1 is a block diagram illustrating a first embodiment of a solid-state imaging device according to the present disclosure.

FIG. 1 is a block diagram illustrating a schematic configuration of a solid-state imaging device according to the present disclosure.

A solid-state imaging device 1 in FIG. 1 includes: a pixel array unit 3 in which a plurality of pixels 2 is arrayed in a matrix (FIG. 2); and peripheral circuit portions in the periphery thereof. In the peripheral circuit portions, a vertical drive unit 4, an AD conversion unit 5, a horizontal drive unit 6, a timing control unit 7, a signal processing circuit 8, an output circuit 9, and so on are included.

The pixel 2 is formed of a photodiode as a photoelectric conversion unit and a plurality of pixel transistors. The plurality of pixel transistors corresponds to, for example, MOS transistors such as a transfer transistor, an amplification transistor, a selection transistor, and a reset transistor. An exemplary circuit configuration of the pixel 2 will be described later with reference to FIGS. 5 and 6.

The vertical drive unit 4 is formed of, for example, a shift register, and drives the pixels 2 in units of row by supplying drive pulses to the respective pixels 2 via pixel drive wiring (not illustrated). More specifically, the vertical drive unit 4 sequentially and selectively scans each of the pixels 2 of the pixel array unit 3 in units of row in a vertical direction, and supplies the AD conversion unit 5 with a pixel signal based on signal charge generated in accordance with an incident light amount in the photodiode of each of the pixels 2 via a vertical signal line provided in common in units of column (not illustrated).

The AD conversion unit 5 applies, to the pixel signal output from each of the pixels 2 in one of the rows of the pixel array unit 3, AD conversion processing and correlated double sampling (CDS) processing in order to remove fixed pattern noise unique to the pixel.

The horizontal drive unit 6 is formed of, for example, a shift register and sequentially outputs horizontal scanning pulses, thereby outputting, to the signal processing circuit 8, a (digital) pixel signal of each of the pixels in a predetermined row that has been subjected to the AD conversion and held in the AD conversion unit 5.

The timing control unit 7 receives an input clock and data to command an operation mode and the like, and further outputs data such as internal information of the solid-state imaging device 1. More specifically, the timing control unit 7 generates a clock signal and a control signal to be reference of operation in the vertical drive unit 4, AD conversion unit 5, and horizontal drive unit 6 based on a vertical synchronization signal, a horizontal synchronization signal, and a master clock. Further, the timing control unit 7 outputs the generated clock signal and control signal to the vertical drive unit 4, AD conversion unit 5, horizontal drive unit 6, and so on.

The signal processing circuit 8 includes at least a correction circuit 11 and a memory 12, executes sensitivity difference correction processing to correct a sensitivity difference between the respective pixels, and outputs a pixel signal subject to this processing to the output circuit 9.

More specifically, the correction circuit 11 executes the sensitivity difference correction processing to correct the sensitivity difference between the respective pixels based on a correction coefficient stored in the memory 12. Further, the correction circuit 11 also executes correction coefficient calculation processing to calculate a correction coefficient needed in executing the sensitivity difference correction processing, and to make the memory 12 store the calculated correction coefficient.

The memory 12 stores the correction coefficient calculated in the correction coefficient calculation processing executed by the correction circuit 11, and supplies the same to the correction circuit 11 when needed.

The output circuit 9 executes buffering for the signals sequentially output from the signal processing circuit 8, and outputs the signals to an external circuit such as an image signal processor (ISP) in a following stage.

The solid-state imaging device 1 thus configured is, for example, a CMOS image sensor of a so-called column AD system in which the CDS processing and the AD conversion processing are performed in units of pixel row.

<Cross-Sectional Structure of Pixels>

Figure 2:
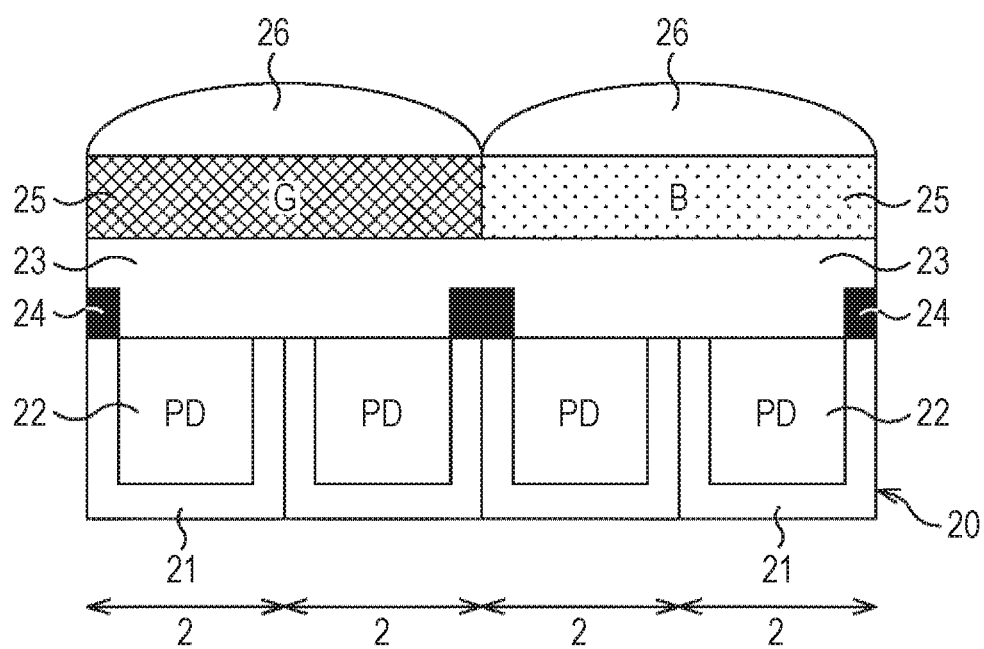
FIG. 2 is a diagram illustrating a cross-sectional structure of pixels.

FIG. 2 is a diagram illustrating a cross-sectional structure of the pixels 2 arranged in a matrix inside the pixel array unit 3 of FIG. 1.

In each of the pixels 2 in the pixel array unit 3, for example, a photodiode PD is formed per pixel by forming an n-type (second conductive type) semiconductor region 22 per pixel on a semiconductor substrate (silicon substrate) 20 formed with a p-type (first conductive type) semiconductor region 21. Meanwhile, in FIG. 2, the semiconductor region 21 is partitioned per pixel for convenience sake, but note that such boundaries do not exist actually.

A front surface side of the semiconductor substrate 20 (lower side in FIG. 2) is formed with: a plurality of pixel transistors adapted to read electric charge accumulated in the photodiode PD; and a multi-layer wiring layer formed of a plurality of wiring layers and an interlayer dielectric film (all not illustrated).

On the other hand, a back surface side of the semiconductor substrate 20 (upper side in FIG. 2) is formed with an oxide film 23 such as a TEOS film interposing a reflection prevention film formed of, for example, a silicon oxide film or the like (not illustrated).

A light shielding film 24 is formed at a two-pixel interval at a pixel boundary portion on the back surface side of the semiconductor substrate 20. The light shielding film 24 may be a light-shielding material, and preferably, has a high light-shielding property and is made of the material that can be precisely processed by microfabrication such as etching. The light shielding film 24 may be formed of a metallic film such as tungsten (W), aluminum (Al), copper (Cu), titanium (Ti), molybdenum (Mo), and nickel (Ni).

A color filter 25 is formed on an upper surface of the oxide film 23. The color filter 25 is any one of red, green, and blue, and transmits light of only a predetermined color (wavelength) to the photodiode PD. The color filter 25 is formed by, for example, performing spin-coating of photopolymer containing a coloring matter such as a pigment or dye.

A microlens (on-chip lens) 26 is formed on the color filter 25. The microlens 26 is formed of, for example, a resin-based material such as a styrene-based resin, an acrylic-based resin, a styrene/acryl copolymer-based resin, or a siloxane-based resin.

Figure 3:
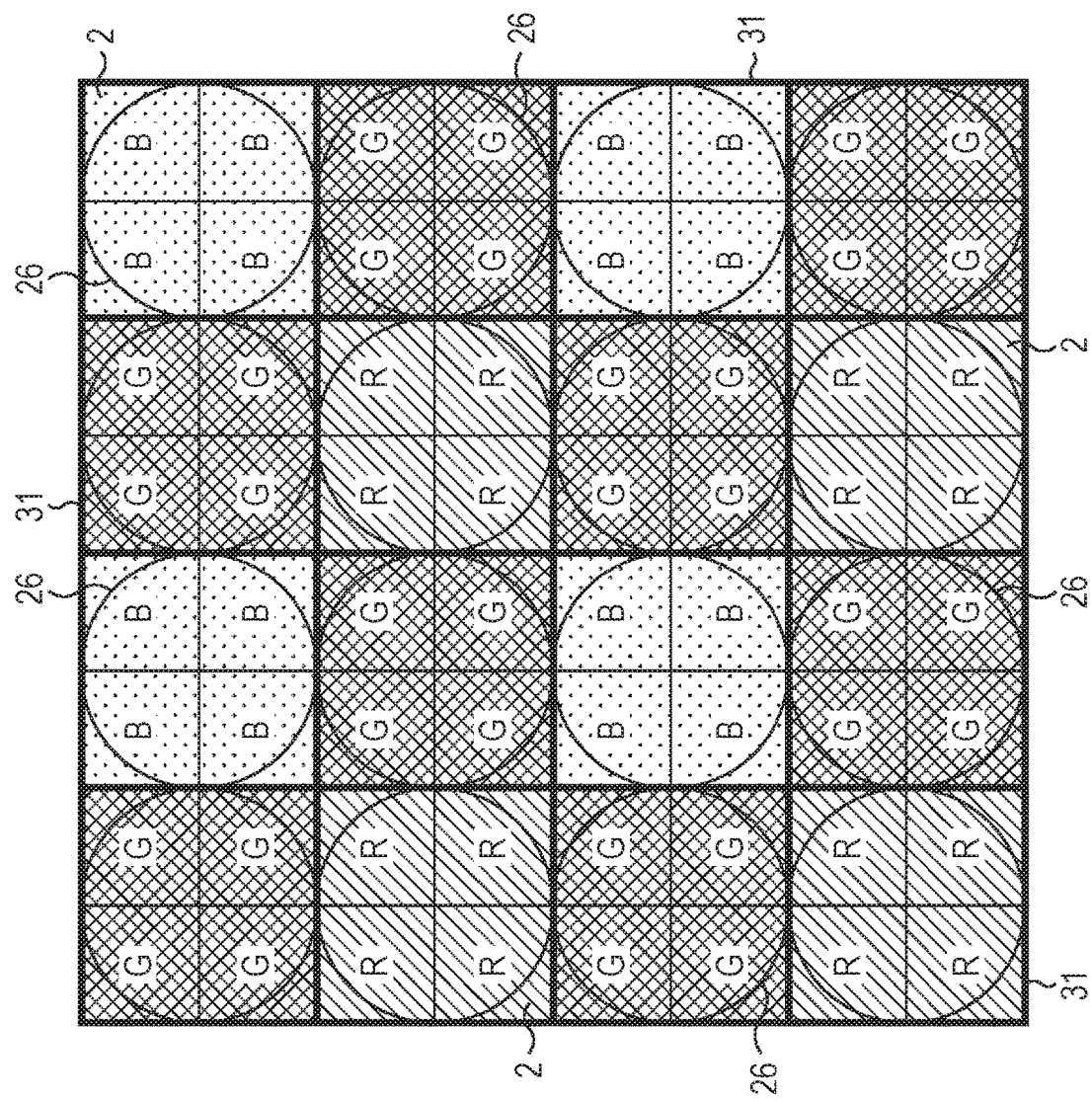
FIG. 3 is an explanatory diagram for a pixel unit.

As illustrated in FIG. 3, one microlens 26 is formed for four pixels having a 2×2 structure in which two pixels are arrayed respectively in a horizontal direction and a vertical direction. The microlens 26 is arranged in a manner such that a boundary of the microlens 26 coincides with at least a boundary between the pixels 2.

Further, as for a color array of the color filter 25 also, the color filters 25 of red, green, or blue are formed such that the photodiodes PD of the four pixels having the 2×2 structure and sharing one microlens 26 receive light having the same wavelength and such that a Bayer array is formed in the unit of four pixels having the 2×2 structure.

In the following description, a sharing unit of the four pixels having the 2×2 structure in which one microlens 26 is shared will be referred to as a pixel unit 31.

Figure 4:
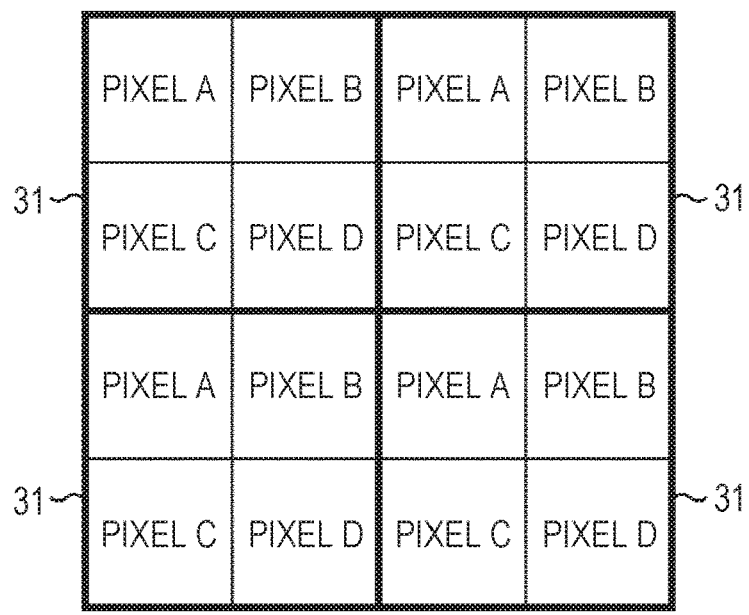
FIG. 4 is an explanatory diagram for the pixel unit.

Further, in the following description, as illustrated in FIG. 4, an upper-left pixel 2 will be referred to as a pixel A, an upper-right pixel 2 as a pixel B, a lower-left pixel 2 as a pixel C, and a lower-right pixel 2 as a pixel D in the four pixels having the 2×2 structure and forming the pixel unit 31. Further, a pixel 2 formed with a red color filter 25 will be referred to as a red pixel, a pixel 2 formed with a green color filter 25 as a green pixel, and a pixel 2 formed with a blue color filter 25 as a blue pixel as well.

The pixels 2 are formed as described above, and the solid-state imaging device 1 is a back-illumination type CMOS solid-state imaging device in which light is incident from the back surface side that is an opposite side of the front surface side of the semiconductor substrate 20 where the pixel transistors are formed.

As illustrated in FIGS. 2 and 3, in the case where one microlens 26 is shared by the plurality of pixels 2, for example, deviation may occur between images formed from the two photodiodes PD because formed positions of the photodiodes PD relative to the microlens 26 are different between the photodiode PD of the pixel A and the photodiode PD of the pixel B. Based on this image deviation, a defocus amount is calculated by calculating a phase deviation amount, and auto-focus can be achieved by adjusting (moving) a photographing lens.

Therefore, in the case where one microlens 26 is shared by the plurality of pixels 2 as illustrated in FIG. 2, auto-focus can be achieved by detecting a phase difference, using a pixel signal of each of the pixels sharing one microlens 26.

<Exemplary Circuit Configuration of Pixel>

Figure 5:
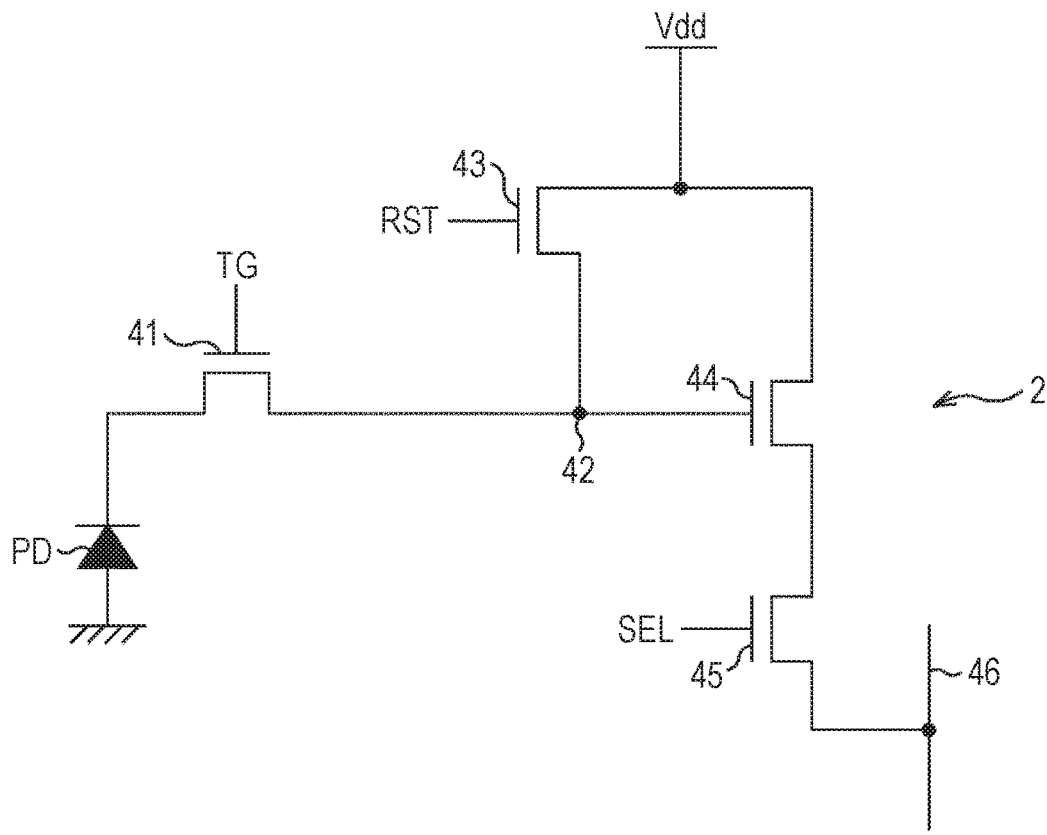
FIG. 5 is a diagram illustrating an exemplary circuit configuration of a pixel.

FIG. 5 is a diagram illustrating an exemplary circuit configuration of the pixel 2.

The pixel 2 includes the photodiode PD as a photoelectric conversion unit, a transfer transistor 41, a floating diffusion (FD) 42, a reset transistor 43, an amplification transistor 44, and a selection transistor 45.

The photodiode PD generates and accumulates electric charge (signal charge) according to a received light amount. The photodiode PD has an anode terminal grounded, and further a cathode terminal connected to the FD 42 via the transfer transistor 41.

The transfer transistor 41 reads electric charge generated at the photodiode PD and transfers the same to the FD 42 when the transfer transistor is turned on by a transfer signal TG.

The FD 42 holds the electric charge read from the photodiode PD. When the reset transistor 43 is turned on by a reset signal RST, the electric charge accumulated in the FD 42 is discharged to a drain (constant voltage source Vdd), thereby resetting potential of the FD 42.

The amplification transistor 44 outputs a pixel signal according to the potential of the FD42. More specifically, the amplification transistor 44 constitutes a source follower circuit with a load MOS (not illustrated) as a constant current source connected via a vertical signal line 46. A pixel signal indicating a level according to the electric charge accumulated in the FD 42 is output to the AD conversion unit 5 from the amplification transistor 44 via the selection transistor 45.

The selection transistor 45 is turned on when the pixel 2 is selected by a selection signal SEL, and outputs the pixel signal generated in the pixel 2 to the AD conversion unit 5 via the vertical signal line 46. Respective signal lines whereby the transfer signal TG, selection signal SEL, and reset signal RST are transmitted are connected to the vertical drive unit 4 in FIG. 1.

The pixel 2 can be configured as described above, but not limited to this configuration, and other configurations can be also adopted.

<Exemplary Circuit Configuration of Pixel Sharing Structure>

For example, the pixels 2 have a pixel sharing structure in which the FD 42, reset transistor 43, amplification transistor 44, and selection transistor 45 are shared by four pixels 2 constituting the pixel unit 31.

Figure 6:
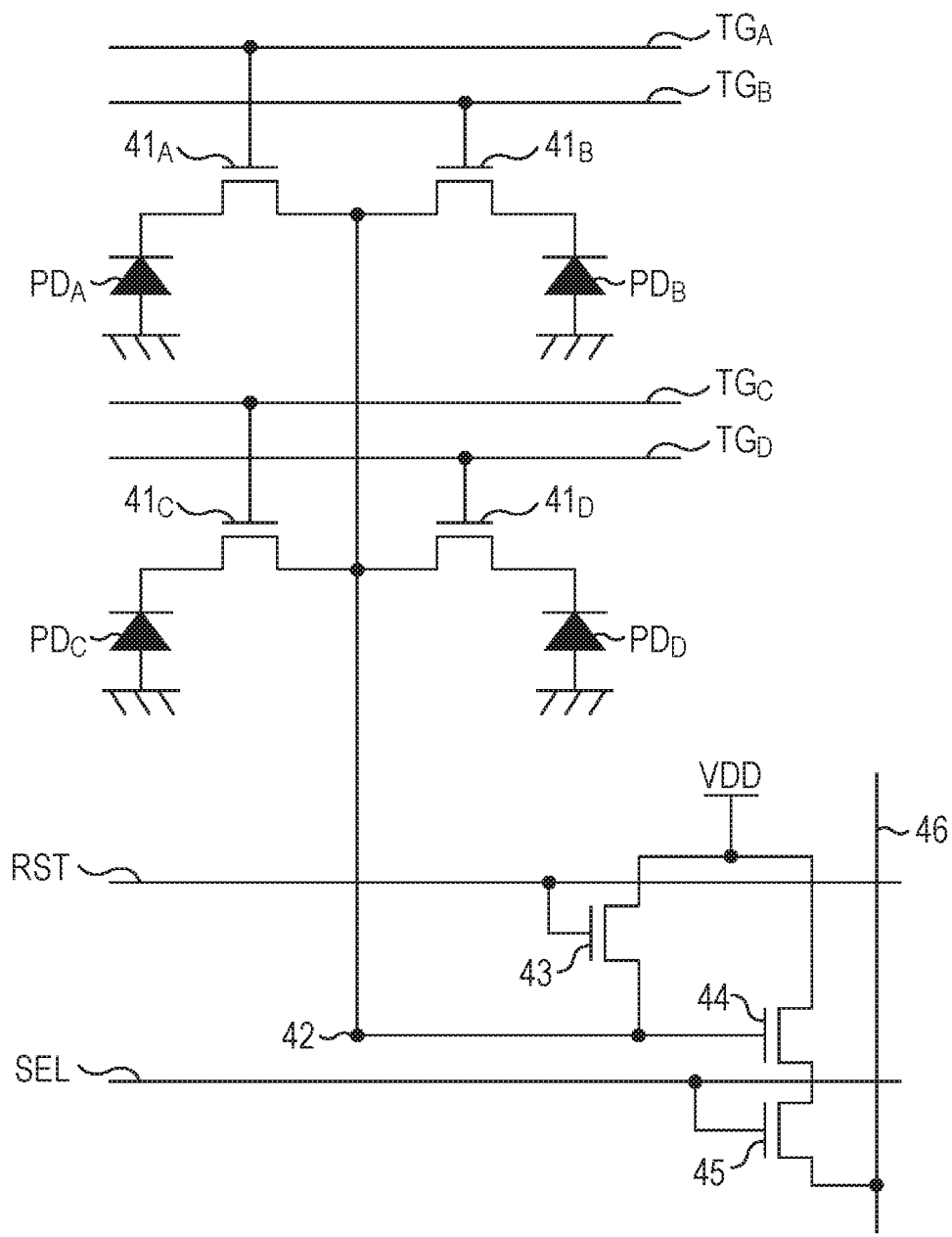
FIG. 6 is a diagram illustrating an exemplary circuit configuration of pixels in the case of having a pixel sharing structure.

FIG. 6 is a diagram illustrating an exemplary circuit configuration of the pixel unit 31 in the case of having the pixel sharing structure.

In the pixel sharing structure, each of the pixels A to D constituting the pixel unit 31 individually includes only the photodiode PD and the transfer transistor 41.

More specifically, the pixel A includes a photodiode $PD_A$ and a transfer transistor $41_A$, the pixel B includes a photodiode $PD_B$ and a transfer transistor $41_B$, the pixel C includes a photodiode $PD_C$ and a transfer transistor $41_C$, and the pixel D includes a photodiode $PD_D$ and a transfer transistor $41_D$.

Further, the FD42, reset transistor 43, amplification transistor 44, and selection transistor 45 are respectively used in common by the four pixels constituting the sharing unit.

In the case where the transfer transistors $41_A$ to $41_D$ of the pixels A to D are separately turned on and electric charge accumulated in the respective photodiodes $PD_A$ to $PD_D$ are sequentially transmitted to the FD 42, a pixel signal per pixel is output to the AD conversion unit 5. In the present embodiment, this imaging mode will be referred to as an independent pixel mode.

On the other hands, in the case where the transfer transistors $41_A$ to $41_D$ of the pixels A to D are simultaneously turned on and electric charge accumulated in the respective photodiodes $PD_A$ to $PD_D$ are simultaneously transmitted to the FD 42, the FD42 functions as an adding unit, and an added signal obtained by adding the pixel signals of the four pixels inside the pixel unit 31 is output to the AD conversion unit 5. In the present embodiment, this imaging mode will be referred to as a pixel adding mode.

Therefore, in accordance with a drive signal from the vertical drive unit 4, the plurality of pixels 2 inside the pixel unit 31 can output a pixel signal per pixel and also can simultaneously output the pixel signals of the plurality of pixels 2 inside the pixel unit 31.

<Description for Sensitivity Difference Caused by Positional Shift of Microlens>

Meanwhile, according to the example illustrated in FIG. 3, the example of disposing the microlens 26 such that a center of the microlens 26 coincides with a center of the pixel unit 31 has been provided, but in an actual manufacturing process, the position of the microlens 26 may be slightly shifted from the center of the pixel unit 31.

In the case where the position of the microlens 26 is shifted from the center of the pixel unit 31, a sensitivity difference is caused between the pixels inside the pixel unit 31.

The sensitivity difference caused by positional shift of the microlens 26 will be described with reference to FIGS. 7 and 8.

Figure 7:
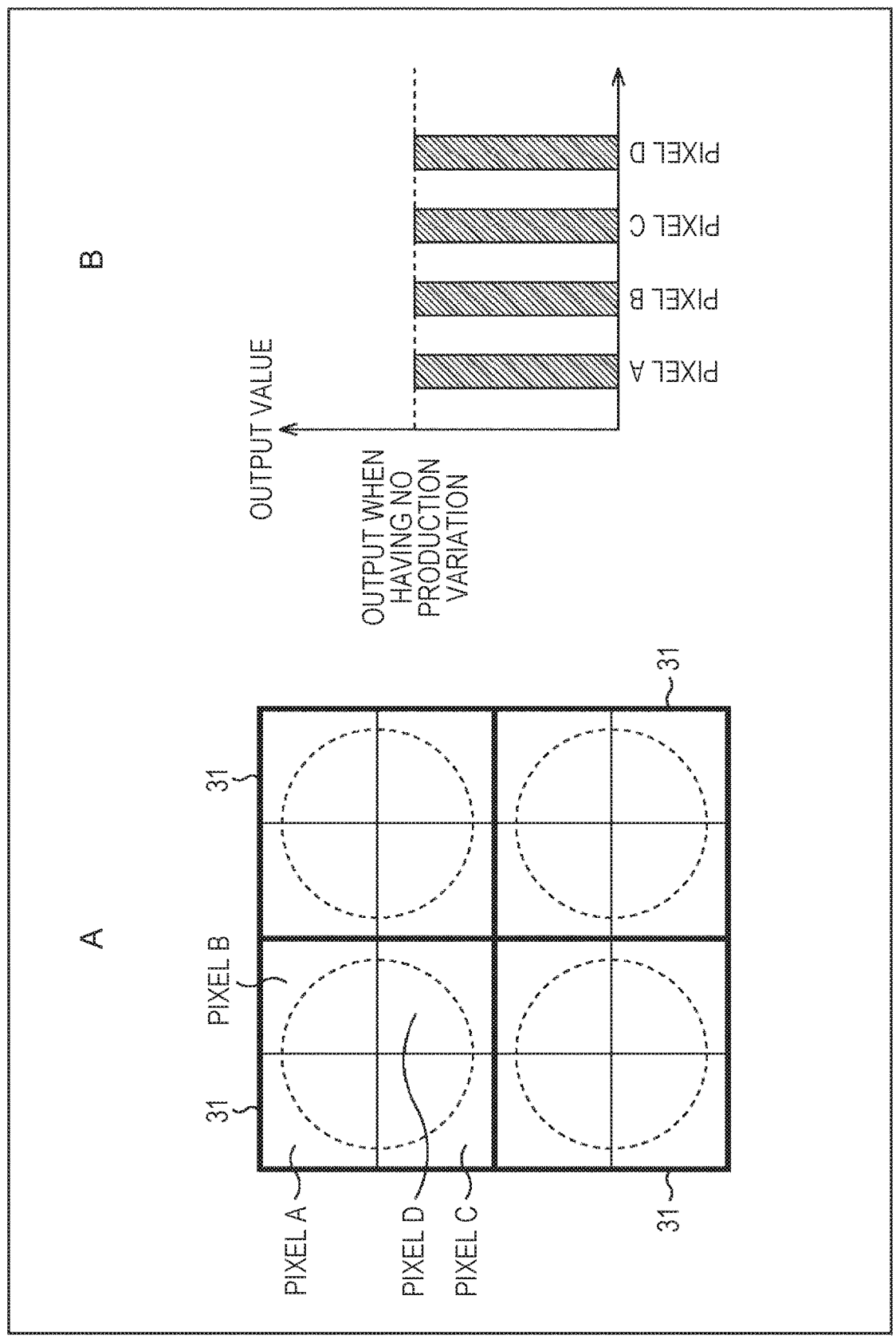
FIG. 7 is an explanatory diagram for a sensitivity difference caused by positional shift of a microlens.

FIG. 7 is an explanatory diagram for light intensity of incident light in the case of no positional shift of a microlens 26.

Light (light flux) from an object is collected at the microlens 26 disposed at an upper portion of the pixel unit 31 at the time of focusing, and reaches the photodiode PD of each of the pixels 2 inside the pixel unit 31.

In a diagram A of FIG. 7, an inner portion of a dashed-line circle shown inside the pixel unit 31 indicates a region having the light intensity of a predetermined value or more inside the pixel unit 31 by receiving incident object light collected at the microlens 26.

In the case of no positional shift of the microlens 26, as illustrated in the diagram A of FIG. 7, the light intensity of the object light collected at the microlens 26 is uniformly distributed to each of the pixels 2. Further, as illustrated in a diagram B of FIG. 7, the pixel signals (output values) output from the respective pixels 2 of the pixels A to D become same.

Figure 8:
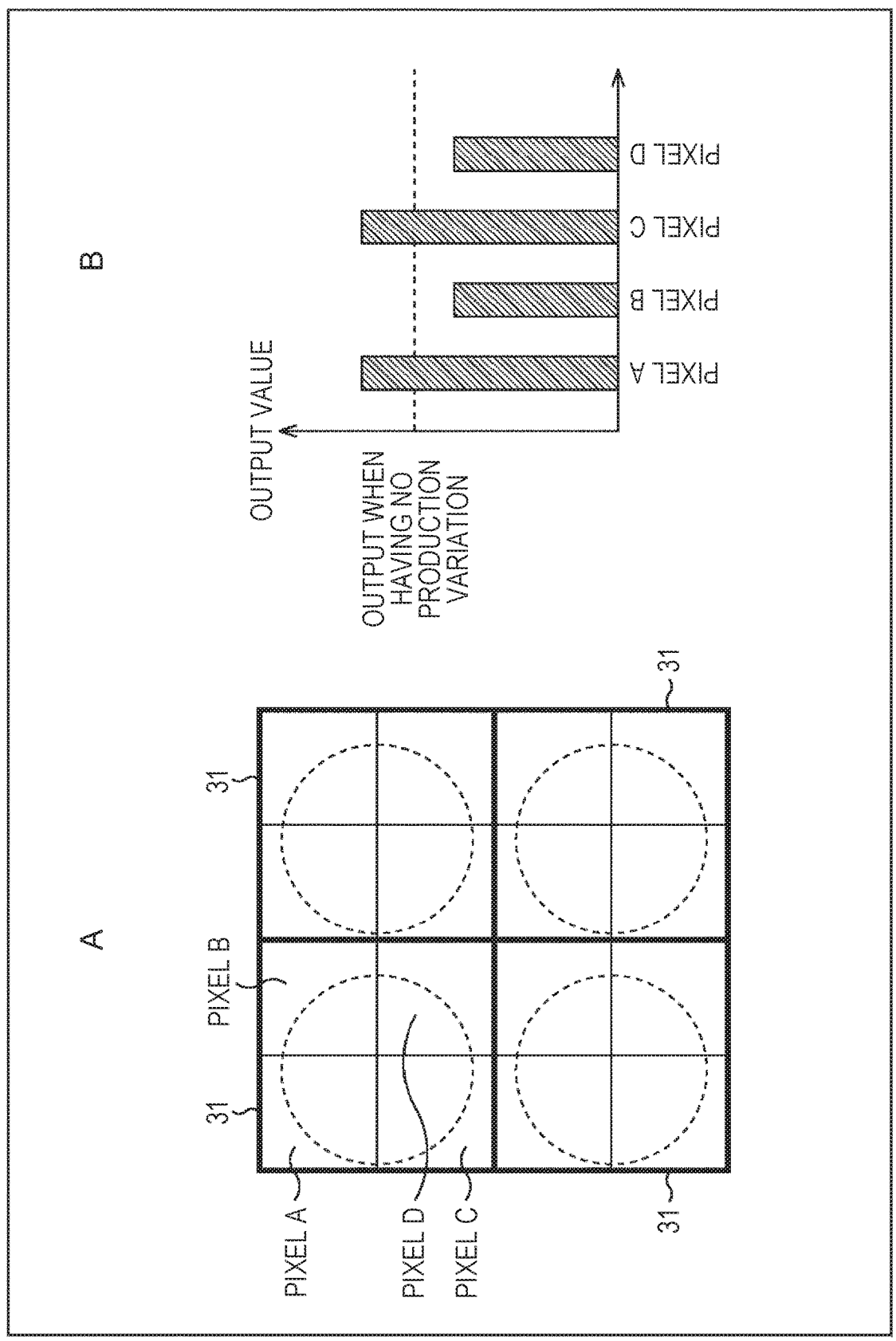
FIG. 8 is an explanatory diagram for the sensitivity difference caused by positional shift of the microlens.

FIG. 8 is an explanatory diagram for the light intensity of incident light in the event of positional shift of a microlens 26.

In the event of positional shift of the microlens 26, the center of the dashed-line circle indicating the region having the light intensity of the predetermined value or more is deviated from the center of the pixel unit 31 as illustrated in a diagram A of FIG. 8, and the region inside the dashed-line circle in each of the pixels is different in each pixel. As a result, as illustrated in a diagram B of FIG. 8, the pixel signals (output values) output from the respective pixels 2 of the pixels A to D are different in the respective pixels.

As described above, in the case where the position of the microlens 26 is shifted from the center of the pixel unit 31, a sensitivity difference is caused between the pixels inside the pixel unit 31.

The signal processing circuit 8 performs the sensitivity difference correction processing to correct the sensitivity difference between the pixels inside the pixel unit 31 caused by a manufacture error such as positional shift of the microlens 26 as described above.

Note that only the positional shift of the microlens 26 has been described as the manufacture error for easy understanding, but the reason causing the sensitivity difference is not limited to the positional shift of the microlens 26. The signal processing circuit 8 can correct, by the sensitivity difference correction processing, a sensitivity difference between the pixels inside the pixel unit 31 caused by reasons including manufacture errors of various kinds of films other than the positional shift of the microlens 26.

<Sensitivity Difference Correction Processing>

The sensitivity difference correction processing executed by the signal processing circuit 8 will be described.

In the sensitivity difference correction processing, attention is paid to a point that a position of the dashed-line circle indicating the region having the light intensity of the predetermined value or more is fitted inside the pixel unit 31 as illustrated in the diagram A of FIG. 8 even when a manufacture error occurs in the solid-state imaging device 1. In other words, according to the sensitivity difference correction processing, there is a precondition that a manufacture error which may cause the dashed-line circle indicating the region having the light intensity of the predetermined value or more to come out of the area of the pixel unit 31 does not occur.

Therefore, in the case of observing a total amount of the incident light per the pixel unit 31, there is no difference between the case of having no manufacture error and the case of having a manufacture error. In other words, there is no difference in the total amount of the incident light between the pixel unit 31 in the diagram A of FIG. 7 and the pixel unit 31 in the diagram A of FIG. 8, and there may be a mere change in a distribution ratio of the light intensity to the respective pixels inside the pixel unit 31. The same happens even in the case where a positional shift direction is varied by each solid-state imaging device 1 because of a different production lot.

Figure 9:
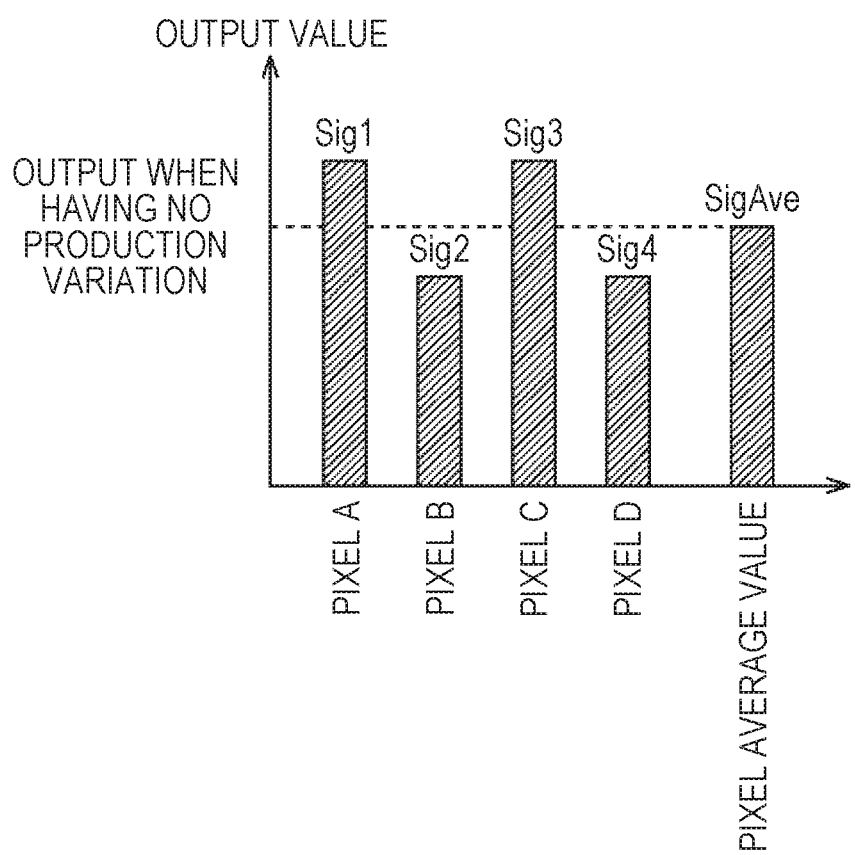
FIG. 9 is an explanatory diagram for sensitivity difference correction processing.

Therefore, as illustrated in FIG. 9, a pixel average value SigAve of the pixel signals of the four pixels inside the pixel unit 31 becomes same as a pixel signal (pixel output value) of each of pixels in an ideal state of having no manufacture error.

Therefore, as the correction coefficient calculation processing, the correction circuit 11 of the signal processing circuit 8 calculates the pixel average value SigAve of the pixel signals of the four pixels inside the pixel unit 31, and calculates a ratio between the pixel average value SigAve and the pixel output value of each of the pixels inside the pixel unit 31 as a correction coefficient.

More specifically, the correction circuit 11 calculates a correction coefficient a of the pixel A inside the pixel unit 31 based on a ratio SigAve/Sig1 (a=SigAve/Sig1) between the pixel average value SigAve and a pixel output value Sig1 of the pixel A. Further, the correction circuit 11 calculates a correction coefficient b of the pixel B inside the pixel unit 31 based on a ratio SigAve/Sig2 (b=SigAve/Sig2) between the pixel average value SigAve and a pixel output value Sig2 of the pixel B. The correction circuit 11 also calculates correction coefficients c and d of the pixels C and D in the same manner based on: c=SigAve/Sig3 and d=SigAve/Sig4. The calculated correction coefficients a to d in each pixel unit 31 are stored in the memory 12.

<Flowchart of Correction Coefficient Calculation Processing>

The correction coefficient calculation processing to calculate a correction coefficient will be described with reference to a flowchart in FIG. 10. The processing is executed in, for example, an inspection process after manufacturing the solid-state imaging device 1.

First, in Step S1, imaging is performed based on the independent pixel mode in a state that the entire pixel array unit 3 of the solid-state imaging device 1 is irradiated with uniform light, and the correction circuit 11 of the solid-state imaging device 1 obtains and stores pixel signals of all of the pixels inside the pixel array unit 3.

In Step S2, the correction circuit 11 sets a predetermined pixel unit 31 inside the pixel array unit 3 as a target unit to be targeted in order to calculate a correction coefficient.

In Step S3, the correction circuit 11 calculates a pixel average value SigAve of pixel signals of four pixels inside the target unit.

In Step S4, the correction circuit 11 calculates the correction coefficients a to d of the respective pixels inside the target unit by acquiring the ratio between the pixel average value SigAve and the pixel output value of each of the pixels inside the target unit.

In Step S5, the correction circuit 11 determines whether all of the pixel units 31 inside the pixel array unit 3 have been set as the target units.

In Step S5, in the case of determining that all of the pixel units 31 have not been set as the target units, the processing returns to Step S2 and the processing thereafter is repeatedly executed. By this, the pixel unit 31 that has not been set as the target unit is set as the target unit, and the correction coefficients a to d of the respective pixels inside the target unit are calculated.

On the other hand, in the case of determining in Step S5 that all of the pixel units 31 have been set as the target units, the processing proceeds to Step S6.

In Step S6, the correction circuit 11 makes the memory 12 store the calculated correction coefficients a to d of the respective pixel units 31 inside the pixel array unit 3, and the correction coefficient calculation processing ends.

Meanwhile, in the above-described correction coefficient calculation processing, provided is the example in which the correction circuit 11 also performs adding processing to add the pixel signals of the four pixels inside the target unit. However, in the case where the pixels 2 have the pixel sharing structure illustrated in FIG. 6, an added signal obtained by adding the pixel signals of the four pixels can be obtained by FD adding inside the pixel unit 31. Therefore, in the case where the pixels 2 have the pixel sharing structure, the added signal obtained by FD adding inside the pixel unit 31 can be used in calculating the pixel average value SigAve.

<Flowchart of Correction Coefficient Calculation Processing Using FD Adding>

Figure 11:
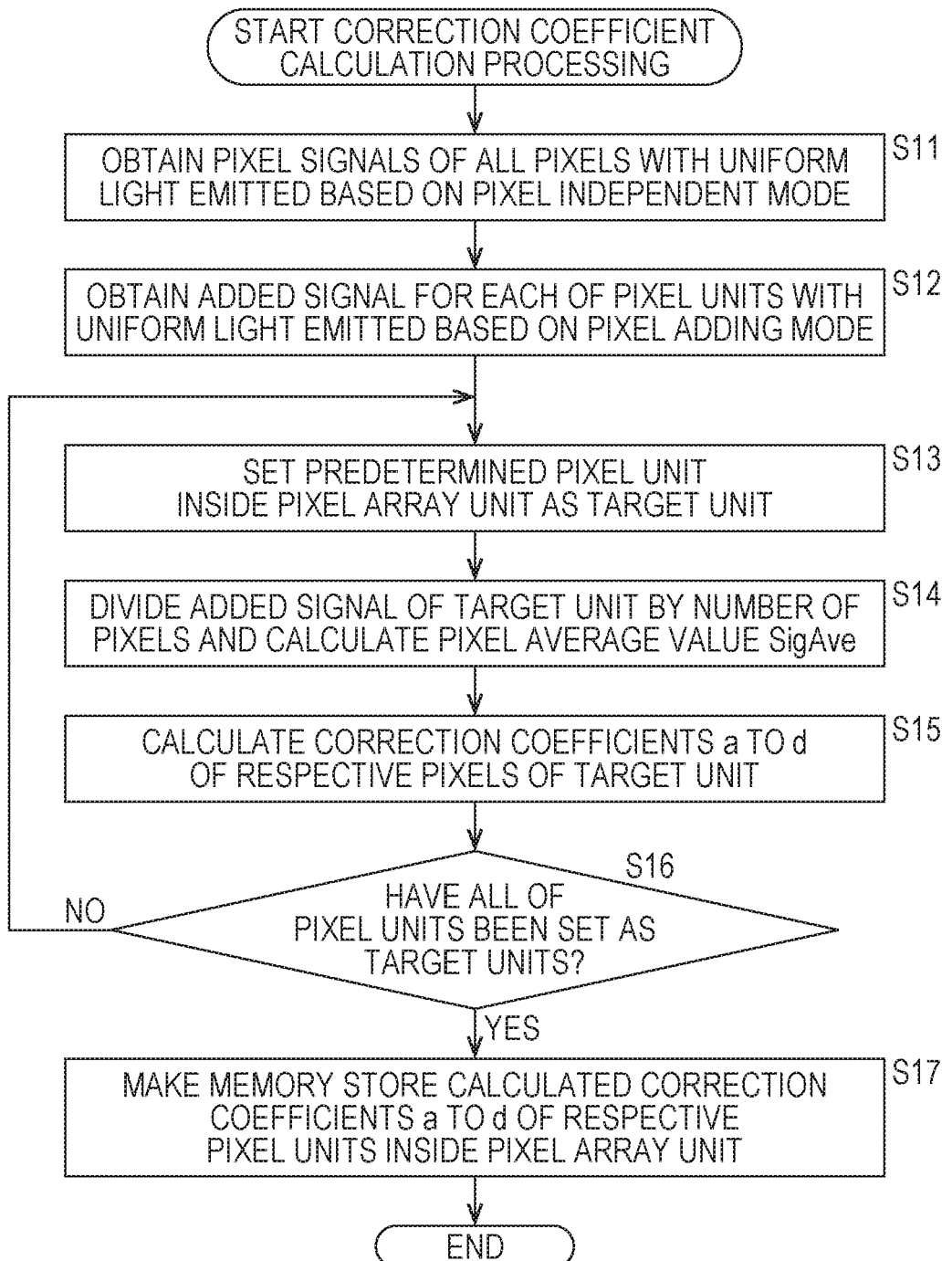
FIG. 11 is an explanatory flowchart for correction coefficient calculation processing using FD adding.

FIG. 11 is a flowchart illustrating the correction coefficient calculation processing in the case of calculating a correction coefficient by using an added signal by FD adding inside the pixel unit 31.

According to this processing, first in Step S11, imaging is performed based on the independent pixel mode in a state that the entire pixel array unit 3 of the solid-state imaging device 1 is irradiated with uniform light, and the correction circuit 11 of the solid-state imaging device 1 obtains and stores pixel signals of all of the pixels inside the pixel array unit 3.

In Step S12, imaging is performed based on the pixel adding mode with uniform light emitted under the same conditions as Step S11, and the correction circuit 11 of the solid-state imaging device 1 obtains and stores the added signal for each of the pixel units 31 inside the pixel array unit 3.

In Step S13, the correction circuit 11 sets a predetermined pixel unit 31 inside the pixel array unit 3 as a target unit to be targeted in order to calculate a correction coefficient.

In Step S14, the correction circuit 11 divides the added signal of the target unit by the number of pixels, and calculates the pixel average value SigAve.

Figure 10:
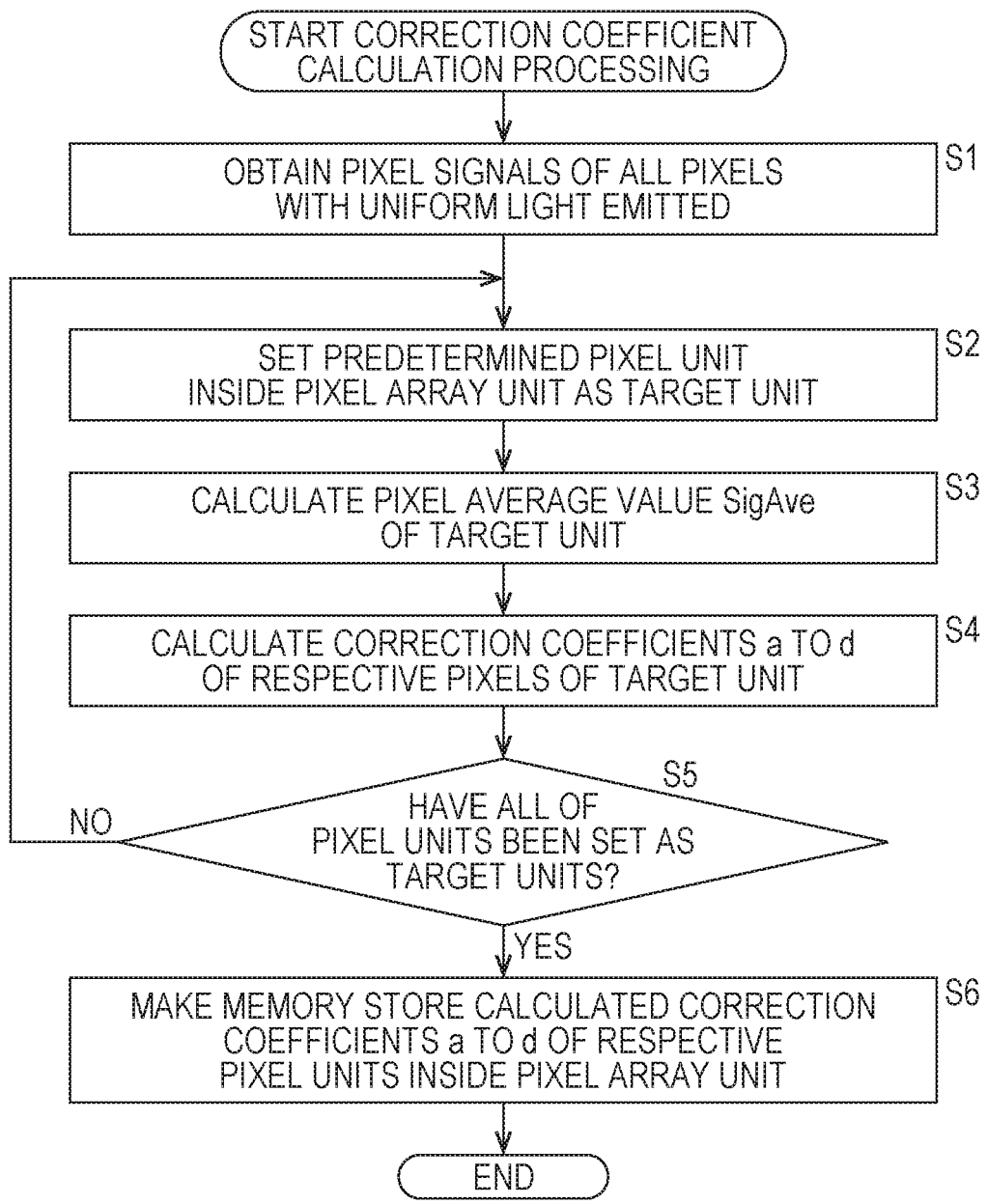
FIG. 10 is an explanatory flowchart for the correction coefficient calculation processing.

The processing from Step S15 to Step S17 is same as the processing from Step S4 to Step 6 in FIG. 10, and therefore, the description therefor will be omitted.

Figure 12:
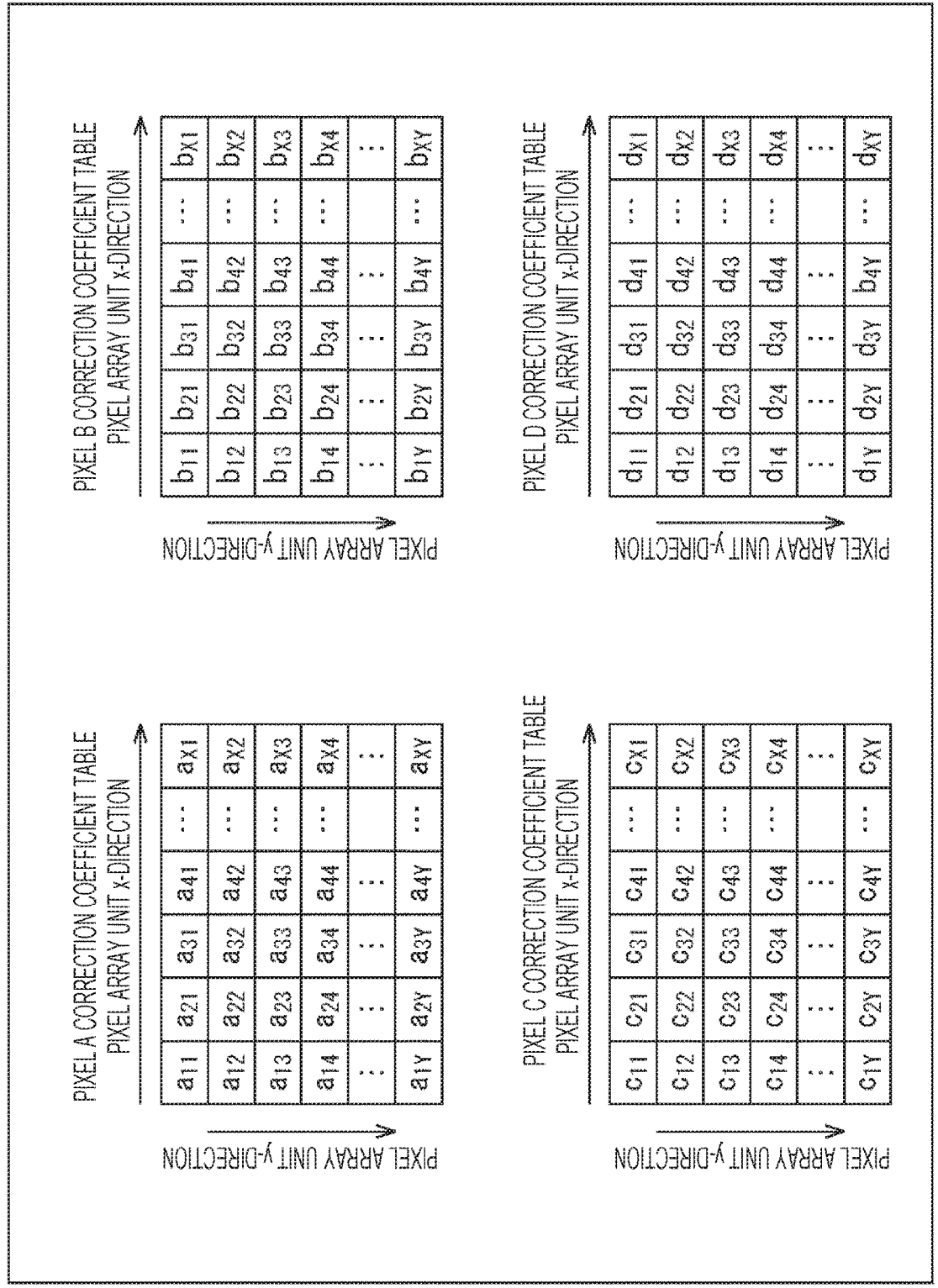
FIG. 12 is a diagram illustrating an exemplary correction table.

FIG. 12 is a diagram illustrating an exemplary correction table stored in the memory 12 by the correction coefficient calculation processing.

As illustrated in FIG. 12, the correction coefficients a to d of the respective pixels of the pixel array unit 3 are divided into the pixel A, pixel B, pixel C, and pixel D, and stored in the memory 12 as the correction tables.

The number of pixel units 31 in the pixel array unit 3 is X×Y that includes X pixel units in an x-direction and Y pixel units in a y-direction. Therefore, pixel A correction coefficients a in the pixel units 31 inside the pixel array unit 3 are calculated as correction coefficients from $a_{11}$ to $a_{xy}$. The correction coefficient $a_{11}$ is a correction coefficient a of the pixel A of the pixel unit 31 positioned at a first pixel unit in the x-direction and a first pixel unit in the y-direction inside the pixel array unit 3 when an upper left corner is set as an origin (0, 0). The correction coefficient $a_{12}$ is a correction coefficient a of the pixel A of the pixel unit 31 positioned at the first pixel unit in the x-direction and a second pixel unit in the y-direction inside the pixel array unit 3. The correction coefficient $a_{21}$ is a correction coefficient a of the pixel A of the pixel unit 31 positioned at a second pixel unit in the x-direction and the first pixel unit in the y-direction inside the pixel array unit 3. The situations are same in other correction coefficients a.

The pixel B correction coefficients b in the pixel units 31 inside the pixel array unit 3 are also calculated as correction coefficients from $b_{11}$ to $b_{xy}$. In the same manner, the pixel C correction coefficients c are also calculated as correction coefficients from $c_{11}$ to $c_{xy}$, and the pixel D correction coefficients d are also calculated as correction coefficients from $d_{11}$ to $d_{xy}$.

When a mount error of an imaging lens is combined, a sensitivity difference may have in-plane distribution (tendency to have gradual change inside the imaging area) relative to an imaging area of the pixel array unit 3. Such in-plane distribution of the sensitivity difference can be resolved by holding the correction coefficients as a two-dimensional table corresponding to the imaging area of the pixel array unit 3 instead of as a single value relative to the pixel array unit 3.

Note that the correction table in FIG. 12 is the example in which the correction coefficients are calculated and stored on a one-to-one basis for the pixels 2 inside the pixel array unit 3. However, the pixel array unit 3 may also be divided into regions of, for example, 10×10 or 100×100, and one set of correction coefficients a to d may be calculated and stored for the divided regions as well. In this case, the same correction coefficients a to d are applied to the plurality of pixel units 31 included in one region. In this case also, the correction coefficients are held as a two-dimensional table. Therefore, even in the event of in-plane distribution, a sensitivity difference can be corrected.

<Flowchart of Sensitivity Difference Correction Processing>

Next, the sensitivity difference correction processing to correct the sensitivity difference by using the correction coefficients stored in the memory 12 by the correction coefficient calculation processing will be described with reference to a flowchart in FIG. 13. The processing is started when imaging is executed after the correction coefficients are stored in the memory 12, for example.

First, in Step S31, the correction circuit 11 obtains a pixel signal of each of pixels imaged in the pixel array unit 3. More specifically, the pixel array unit 3 executes imaging in accordance with predetermined timing, and outputs the pixel signal obtained as a result thereof to the AD conversion unit 5. The AD conversion unit 5 converts, to a digital signal, the pixel signal of each of the pixels in the pixel array unit 3 in accordance with control of the horizontal drive unit 6, and outputs the digital pixel signal to the correction circuit 11. As a result, the digital pixel signal of each of the pixels imaged in the pixel array unit 3 is supplied to the correction circuit 11.

In Step S32, the correction circuit 11 obtains a correction coefficient stored in the memory 12. Note that this processing can be omitted in the case where the correction coefficient has been already read in the memory 12.

In Step S33, the correction circuit 11 multiplies a pixel signal of a predetermined pixel supplied from the AD conversion unit 5 by a correction coefficient (any one of a to d) of the pixel, and calculates the pixel signal subjected to sensitivity difference correction. The calculated pixel signal subjected to sensitivity difference correction is output to the output circuit 9.

The processing in Step S33 is executed every time when the pixel signal is supplied from the AD conversion unit 5, and the sensitivity difference correction processing ends when supply of the pixel signal from the AD conversion unit 5 is stopped.

According to the above-described sensitivity difference correction processing, the sensitivity difference is corrected so as to conform to the pixel output value in the ideal state of having no production variation as illustrated in FIG. 7 in any solid-state imaging device 1. Therefore, when the model number of the solid-state imaging device 1 is same, the pixel signal having the same sensitivity can be output regardless of production time and a production lot, for example. In other words, sensitivity correction in which a sensitivity difference between solid-state imaging devices is suppressed can be performed.

By this, for example, detection accuracy of a phase difference can be prevented from being varied by each chip, and luminance of an image can be prevented from being varied by each chip when pixel output of the phase difference is utilized for preview and the like at the time of focusing.

According to the present disclosure, the pixel signal having the same sensitivity can be obtained when the model number of the solid-state imaging device 1 is the same. Therefore, control for a shutter value and image processing for a captured image are easily performed in an imaging device and the like in which the solid-state imaging device 1 is incorporated.

<Sensitivity Difference Correction Processing Per Wavelength>

Figure 14:
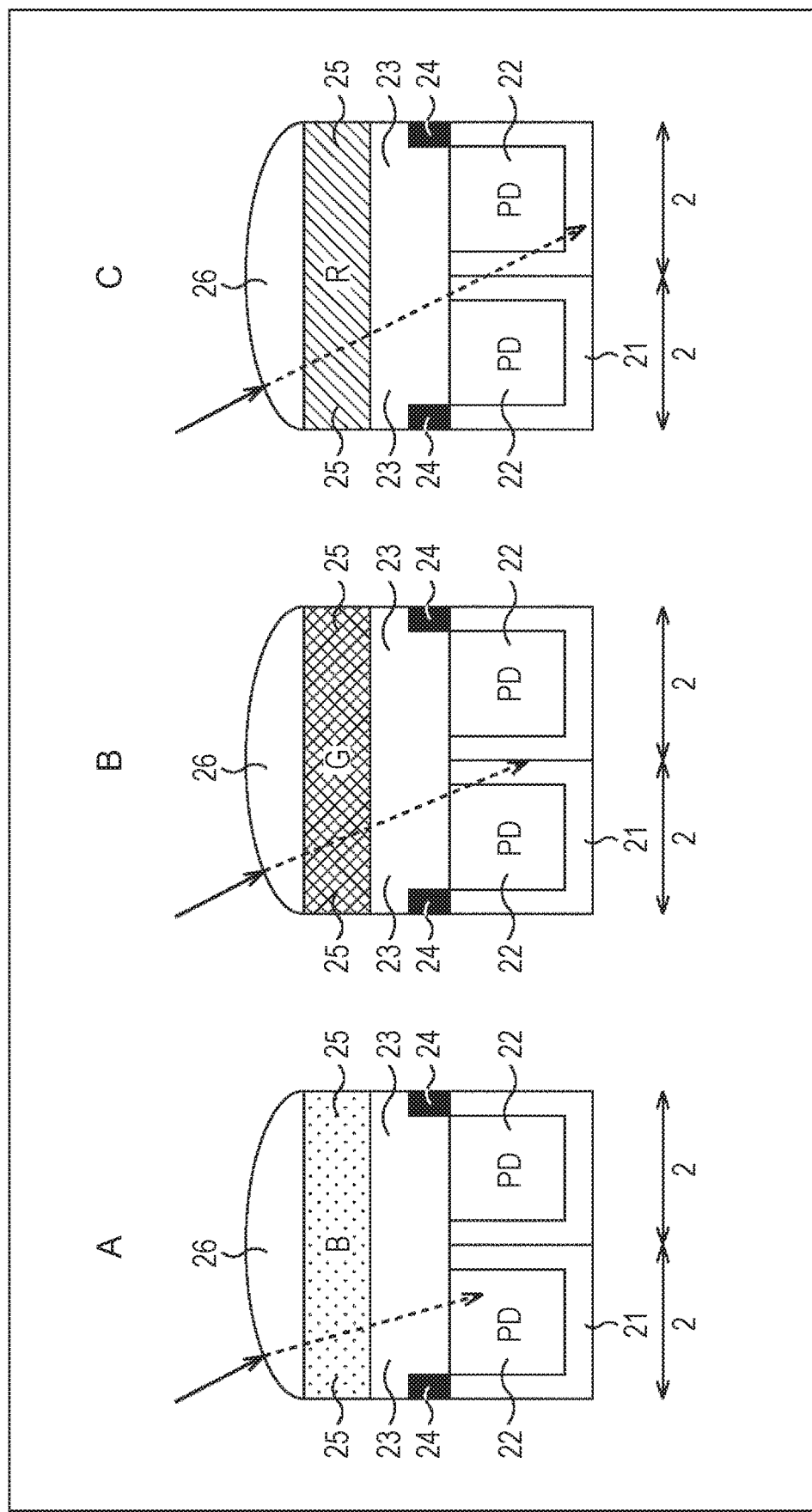
FIG. 14 is an explanatory diagram for the sensitivity difference correction processing per wavelength.

The factors that may cause variation of the sensitivity difference can be a wavelength difference of incident light besides production variation. As illustrated in FIG. 14, for example, red light having a long wavelength and blue light having a short wavelength have different characteristics in refraction and diffraction as well as different reaching depths inside a silicon layer.

Figure 15:
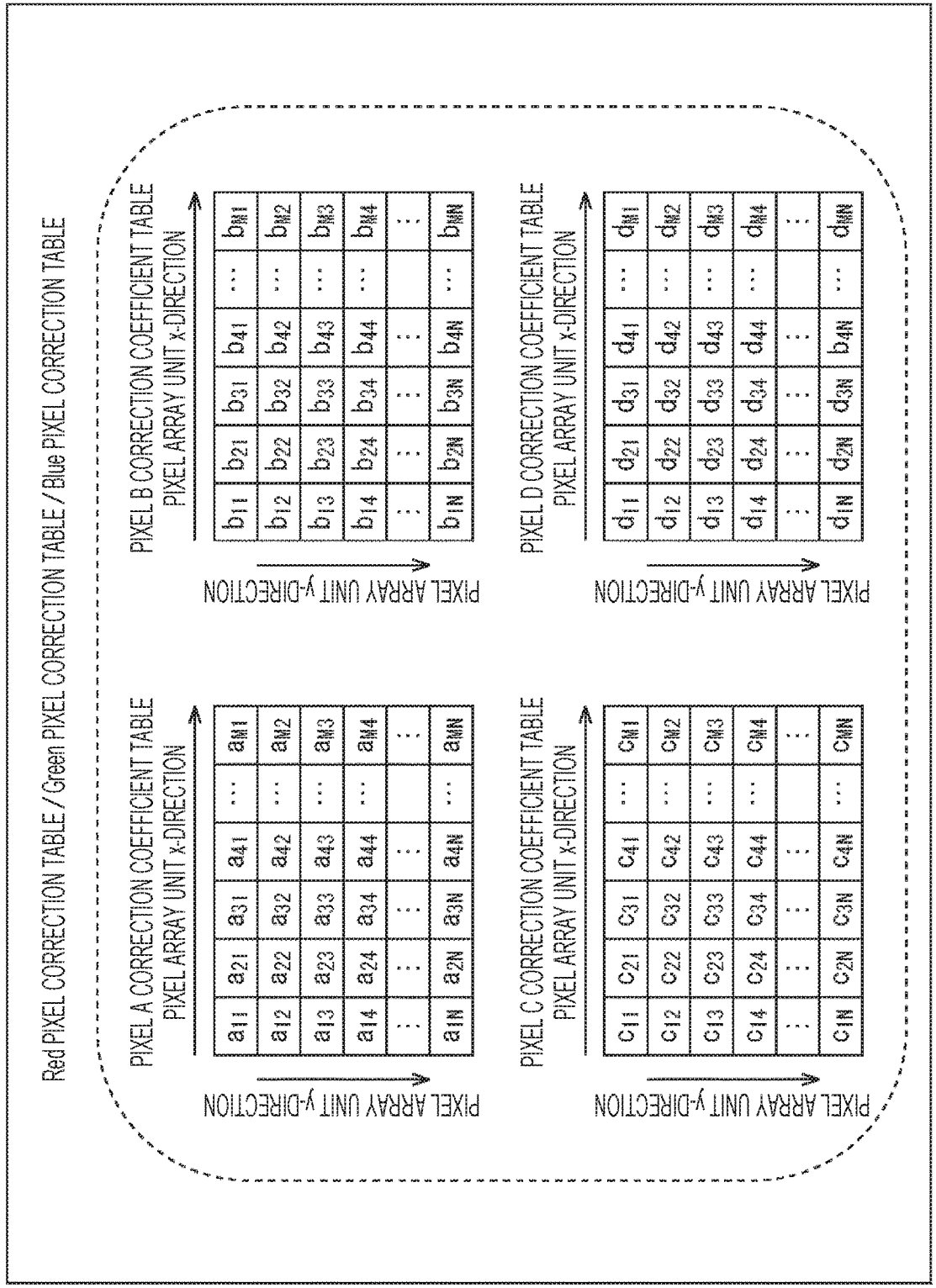
FIG. 15 is an explanatory diagram for the sensitivity difference correction processing per wavelength.

Therefore, as illustrated in FIG. 15, the signal processing circuit 8 of the solid-state imaging device 1 can provide a correction table same as FIG. 12 per wavelength (per color) of the light received by the pixel 2, such as a red pixel correction table, a green pixel correction table, and a blue pixel correction table. For example, light that passes through the red color filter 25 under white light having a specific color temperature is the light having a wavelength distribution within a red wavelength band. Therefore, a correction table per wavelength of the light corresponds to calculation of correction coefficients for the light having representative wavelength distribution thereof.

Thus, in the case of having the correction table per wavelength of the light, the pixel array unit 3 is irradiated with uniform light having a single color temperature in Step S1 of the correction coefficient calculation processing in FIG. 10, and a pixel signal of each pixel is obtained. Then, in Step S6, the correction tables are created separately for the red pixel, green pixel, and blue pixel respectively, and stored in the memory 12. By this, the sensitivity difference can be corrected by using the correction coefficients calculated for each of wavelength bands of red, green, and blue colors. Therefore, highly accurate correction can be performed.

Meanwhile, the number of the correction coefficients a to d (M×N) in each of the red pixel correction table, green pixel correction table, and blue pixel correction table in FIG. 15 is a value corresponding to the number of the red pixels, green pixels, and blue pixels inside the pixel array unit 3.

<Sensitivity Difference Correction Processing in RGBW Array>

In the above-described example, description has been provided for the case where the red, green, or color filters 25 are arranged in the Bayer array by setting, as a unit, the four pixels having the 2×2 structure in each of which the microlens 26 is disposed.

Figure 16:
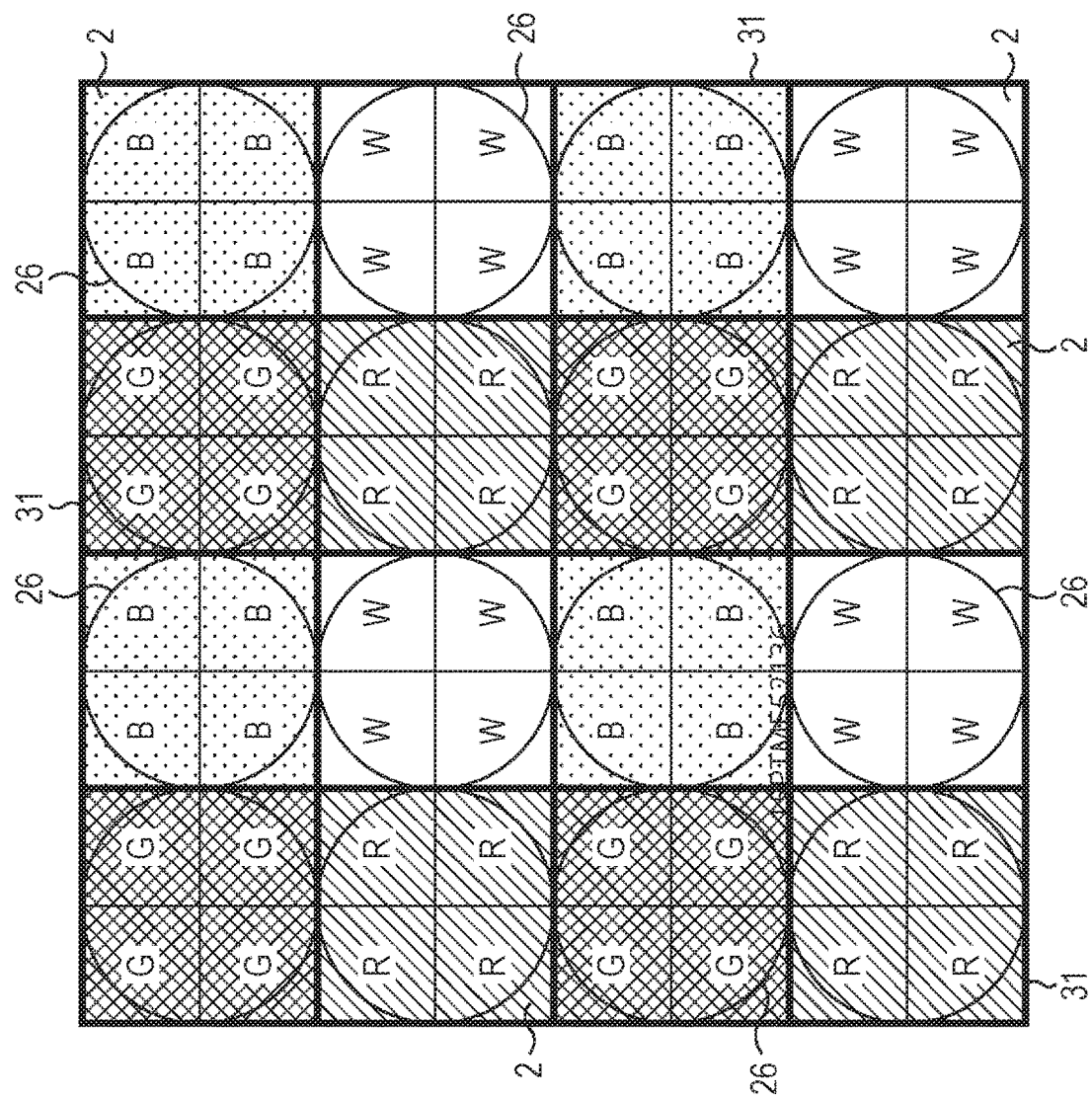
FIG. 16 is an explanatory diagram for the sensitivity difference correction processing for a white pixel.

However, the color array of the color filters 25 may be another type of array, for example, a color array (RGBW array) of red, green, blue, or white as illustrated in FIG. 16 by setting, as a unit, the four pixels having the 2×2 structure in each of which the microlens 26 is disposed. The white color filter 25 is a filter that transmits light in an entire wavelength band.

In the photodiode PD of the pixel 2 having the white color filter 25 (hereinafter also referred to as white pixel), the light of the entire wavelength band including red, green, and blue is incident. Therefore, a sensitivity difference is varied by a color temperature of an object.

Figure 17:
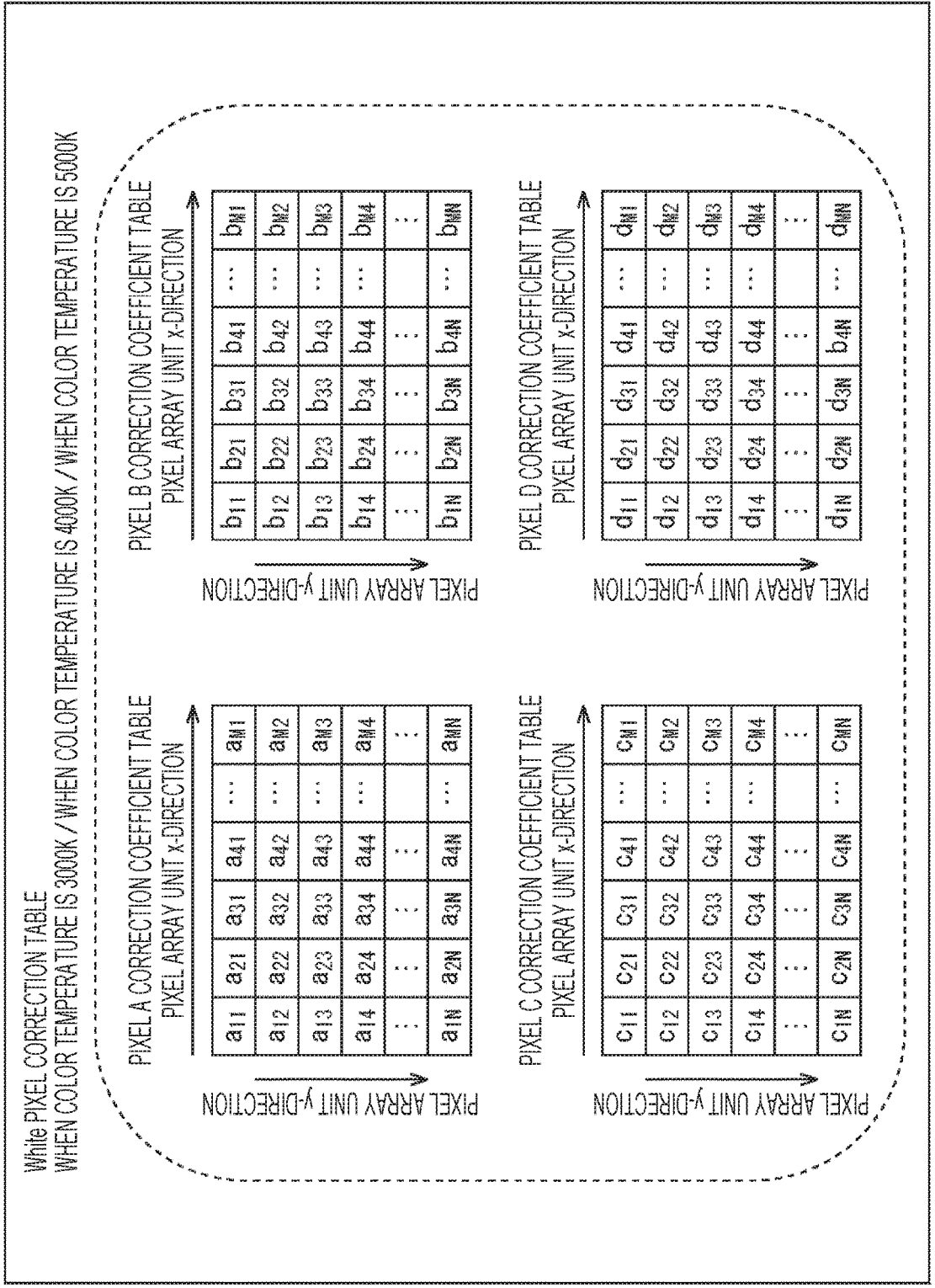
FIG. 17 is an explanatory diagram for the sensitivity difference correction processing for the white pixel.

Therefore, white pixel correction tables for respective color temperatures, for example, a correction table when the color temperature is 3000 K, a correction table when the color temperature is 4000 K, and a correction table when the color temperature is 5000 K, are created and stored in the memory 12 as illustrated in FIG. 17 as the white pixel correction tables.

In the correction coefficient calculation processing in the case of having the above-described white pixel correction tables for the respective color temperatures, the processing to obtain a pixel signal in the state that the pixel array unit 3 is irradiated with uniform light having a predetermined color temperature is executed for the white pixel in the pixel array unit 3 with respect to each of the color temperatures for which the white pixel correction tables are created.

Figure 13:
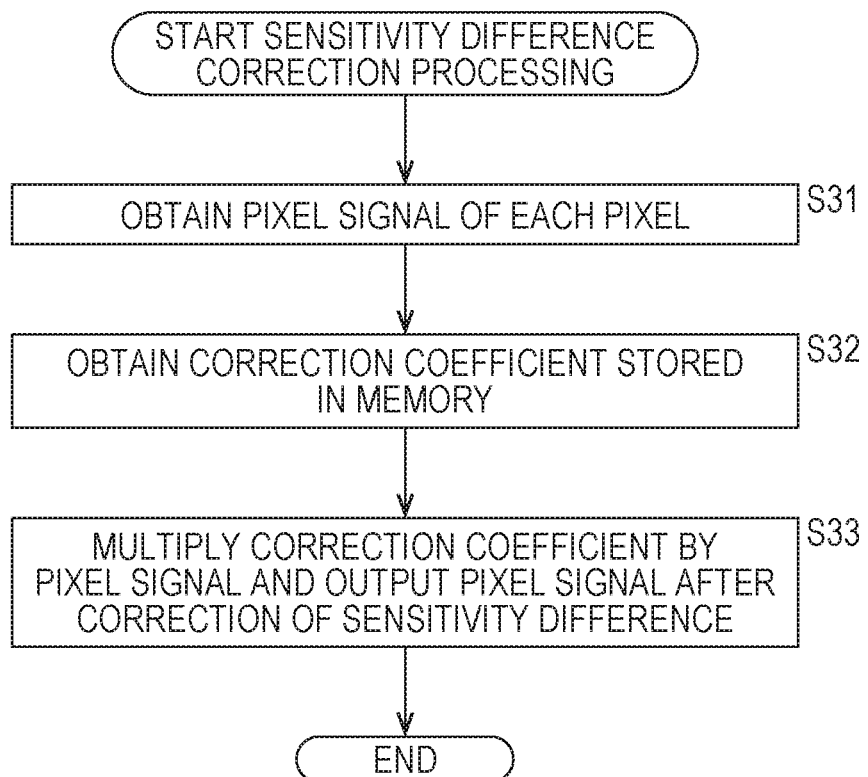
FIG. 13 is an explanatory flowchart for sensitivity difference correction processing.

Further, in the sensitivity difference correction processing of FIG. 13, the correction circuit 11 calculates, from a white pixel to be corrected among pixel signals of respective pixels obtained by imaging, a pixel signal ratio (sensitivity ratio) R/G between the red pixel and the green pixel, and a pixel signal ratio (sensitivity ratio) B/G between the blue pixel and the green pixel within a local region inside a predetermined range, and estimates a color temperature of the incident light based on the result. Further, the correction circuit 11 obtains a correction coefficient by using the white pixel correction table of the estimated color temperature as the white pixel correction table, and calculates a pixel signal subjected to sensitivity difference correction.

Since the light of the entire wavelength band is incident in the white pixel, a sensitivity difference depending on the wavelength and the color temperature of the object can be easily viewed. However, as described above, highly accurate correction can be performed by using the correction table corresponding to the color temperature of the incident light as the white pixel correction table.

In the case where the color array of the color filters 25 is the RGBW array, the correction table for each of the colors illustrated in FIG. 15 can be used for the red pixel, green pixel, and blue pixel other than the white pixel. Alternatively, same as the white pixel, the correction table per color temperature may be further created for the red pixel, green pixel, and blue pixel as well, and the correction table corresponding to the color temperature estimated based on the pixel signal ratio (sensitivity ratio) using the red pixel, green pixel, and blue pixel may also be used at the time of imaging.

In the case of using the correction table per wavelength or per color temperature, correction can be performed while resolving the sensitivity difference varied depending on the color temperature of the object and the wavelength of the light. Therefore, the sensitivity difference can be corrected with higher accuracy.

<Modified Example of Pixel Unit Arrangement>

In the above-described examples, the pixel array unit 3 is formed by regularly arraying the pixel units 31 in a matrix as illustrated in FIGS. 3 and 16.

Figure 18:
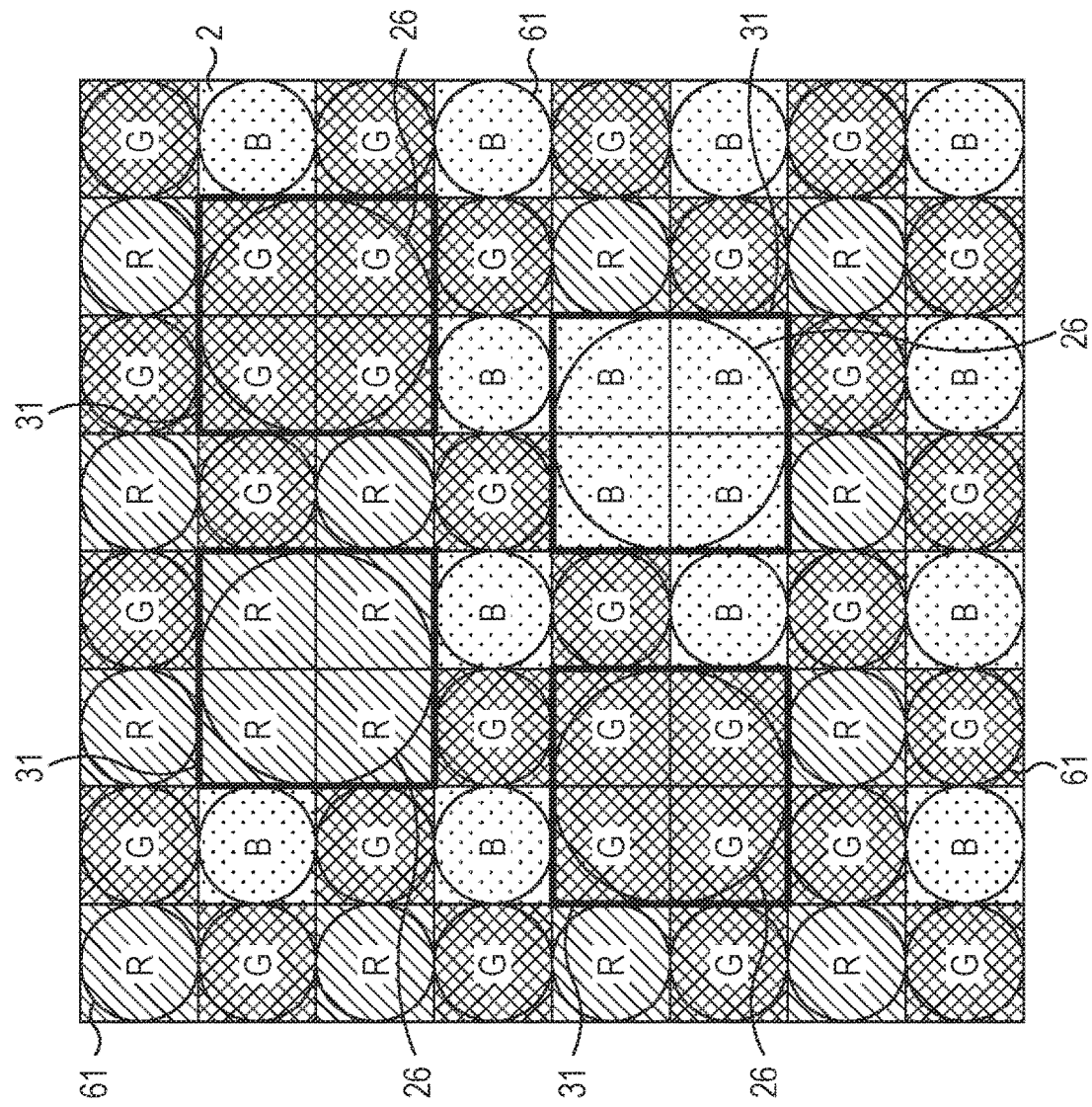
FIG. 18 is a diagram illustrating a modified example of arrangement of the pixel unit.

However, as illustrated in FIG. 18, the pixel units 31 may be partly dotted inside the pixel array unit 3, for example.

In a pixel 2 not included in the pixel units 31 inside the pixel array unit 3, for example, the color filter 25 and the microlens 61 are formed in each pixel as illustrated in FIG. 18.

As for the color array of the color filters 25 in the pixel unit 31, red, green, green, and blue are arrayed in the Bayer array in the four local pixel units 31 in the example of FIG. 18. However, the color filters 25 may also be unified to one predetermined color (green, for example) in all of the pixel units 31 inside the pixel array unit 3.

<Other Exemplary Structures of Pixel Unit>

Figure 19:
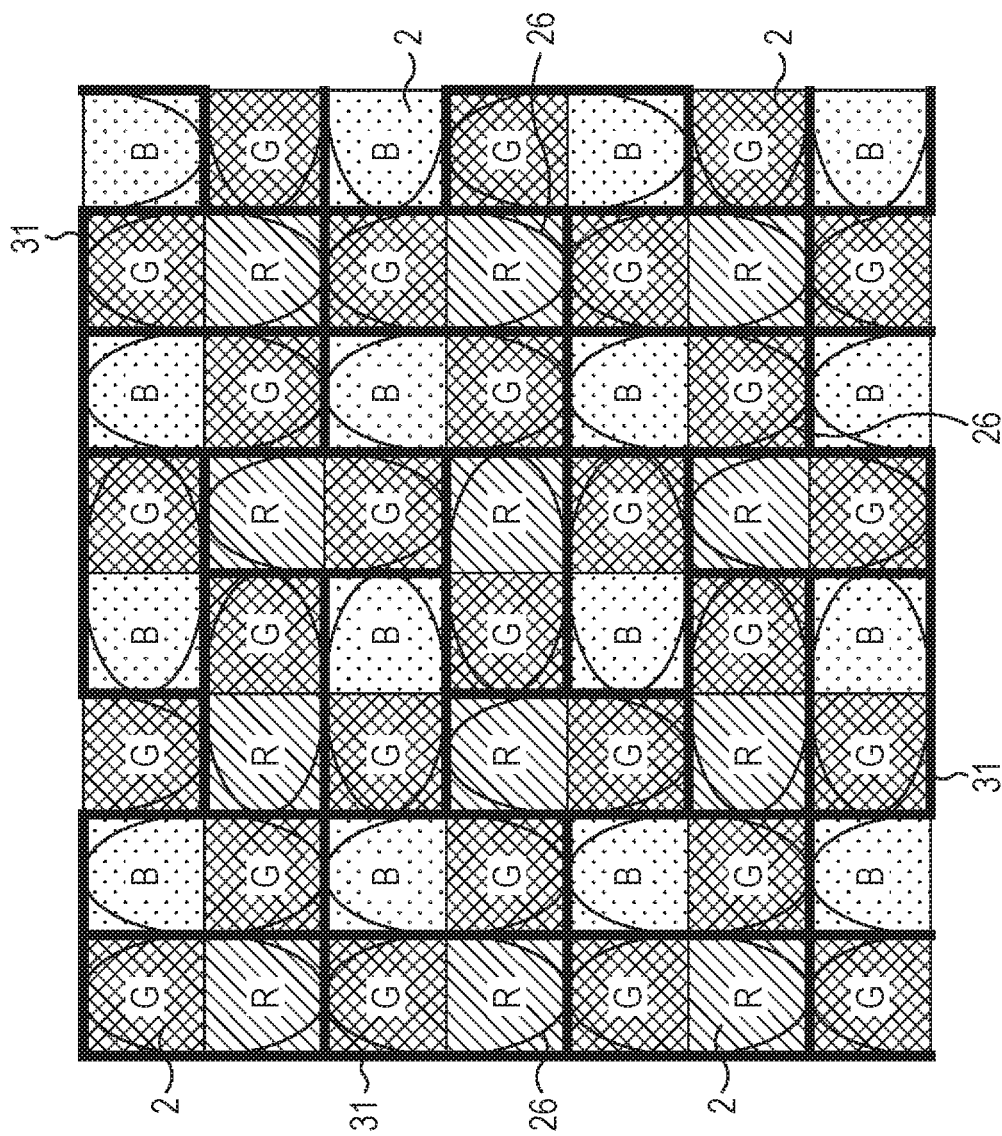
FIG. 19 is a diagram illustrating a first exemplary structure in which the pixel unit is formed of two pixels.

FIG. 19 is a diagram illustrating another exemplary structure of the pixel unit 31.

In the above-described examples, the pixel unit 31 is formed of the four pixels, but in FIG. 19, the pixel unit 31 is formed of two pixels, and the microlens 26 is also shared by the two pixels constituting the pixel unit 31.

The color filter 25 of each of the pixels 2 are formed so as to form the Bayer array in the unit of one pixel as illustrated in FIG. 19, for example.

In the case where the pixel unit 31 is thus formed of the two pixels, a phase difference is detected by, for example, using pixel signals of the two pixels in which the same color filters 25 are formed and a shape (curve) of the microlens 26 is symmetric.

Figure 20:
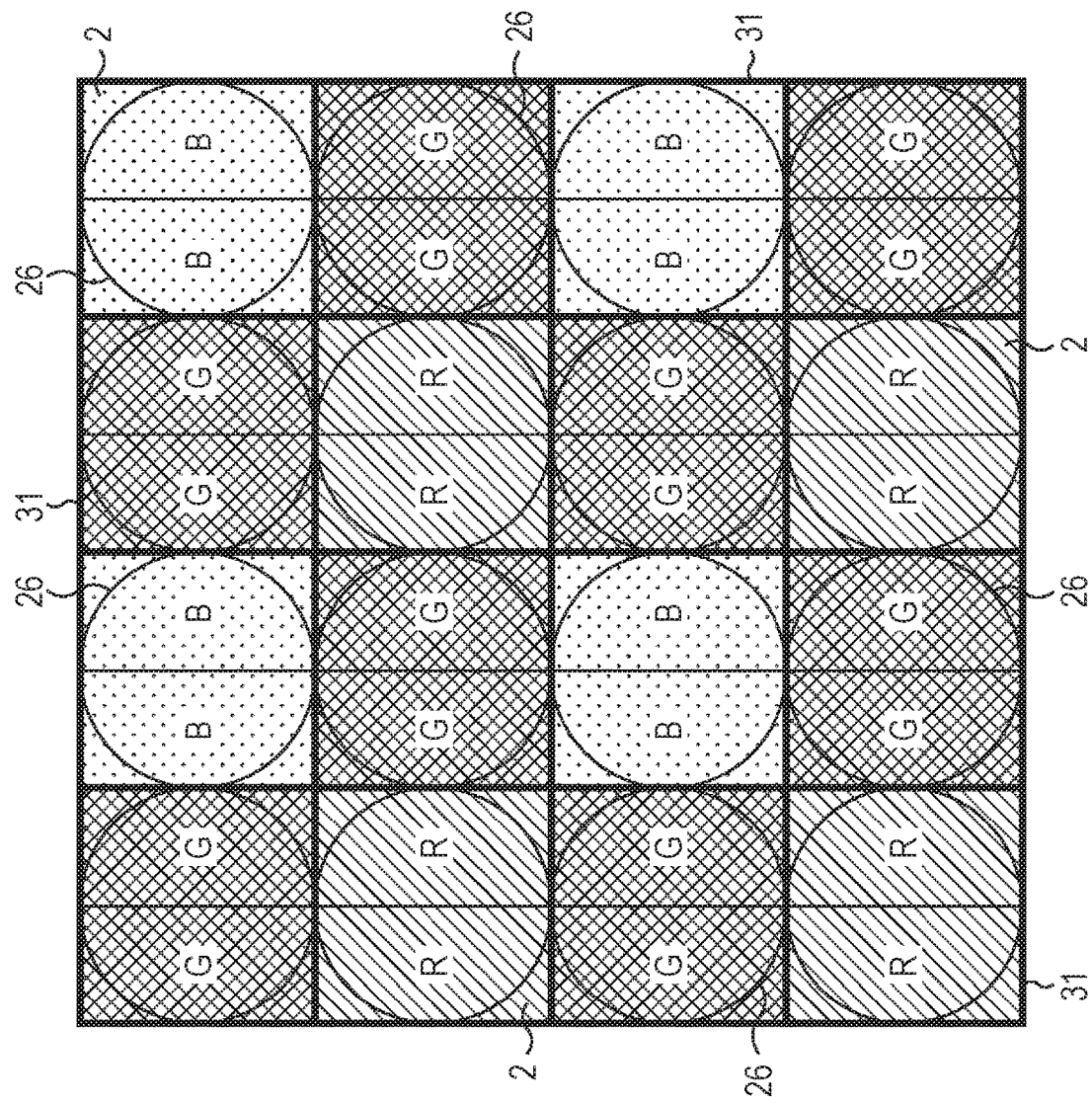
FIG. 20 is a diagram illustrating a second exemplary structure in which the pixel unit is formed of two pixels.

FIG. 20 is a diagram illustrating another different example in which the pixel unit 31 is formed of two pixels.

In FIG. 20, one pixel is formed in a vertically long rectangular shape, and the two pixels constituting the pixel unit 31 forms a square. The microlens 26 is arranged in each pixel unit 31, and the color filters 25 are formed such that the Bayer array is formed in each pixel units 31.

A phase difference is detected in the pixel unit 31 illustrated in FIG. 20 by using pixel signals of the two pixels in which the same color filter 25 is formed and the shape (curve) of the microlens 26 is symmetric. For example, the phase difference is detected by using, for example, the pixel signals of the two pixels horizontally adjacent to each other inside the pixel unit 31.

Figure 21:
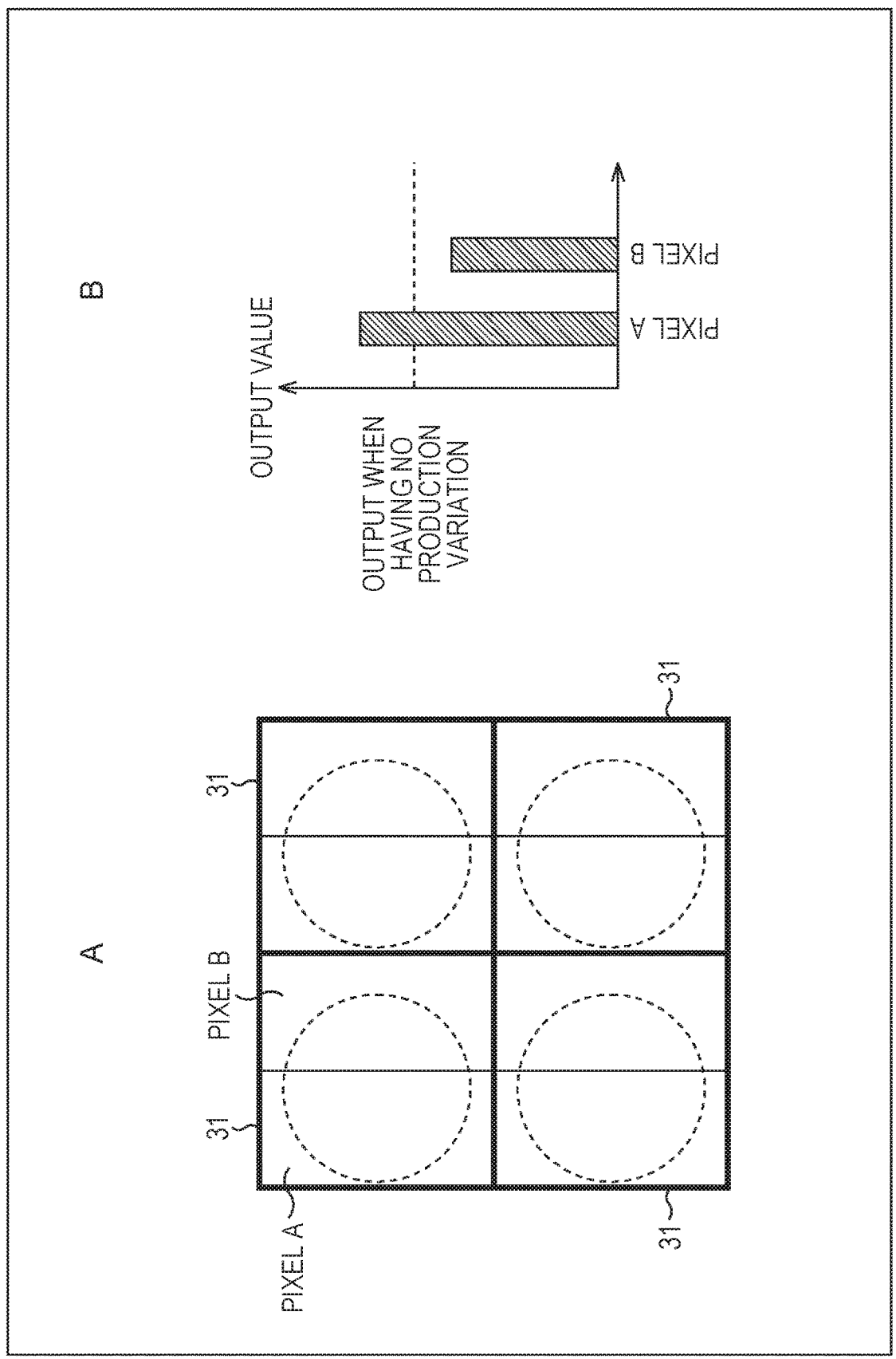
FIG. 21 is an explanatory diagram for correction coefficient calculation processing in the case where the pixel unit is formed of the two pixels.

FIG. 21 is an explanatory diagram for light intensity of incident light in the event of positional shift of a microlens 26 in the pixel unit 31 illustrated in FIG. 20.

In the event of positional shift of the microlens 26, as illustrated in a diagram A of FIG. 21, a center of a dashed-line circle indicating a region having light intensity of a predetermined value or more is deviated from the center of the pixel unit 31, and the region inside the dashed-line circle in each of the pixels is different between a pixel A and pixel B constituting the pixel unit 31. As a result, as illustrated in a diagram B of FIG. 21, pixel signals (output values) output from the respective pixels 2 of the pixel A and the pixel B are different.

The signal processing circuit 8 performs the correction coefficient calculation processing to calculate a correction coefficient adapted to correct a sensitivity difference between the two pixels inside the pixel unit 31 caused by a manufacture error such as positional shift of the microlens 26 as described above.

In other words, the correction circuit 11 of the signal processing circuit 8 calculates a pixel average value SigAve of the pixel signals of the two pixels inside the pixel unit 31 and calculates, as the correction coefficients, a ratio between the pixel average value SigAve and the pixel output value of each of the pixels A and B inside the pixel unit 31.

More specifically, the correction circuit 11 calculates a correction coefficient a of the pixel A inside the pixel unit 31 based on a ratio SigAve/Sig1 (a=SigAve/Sig1) between the pixel average value SigAve and a pixel output value Sig1 of the pixel A. Further, the correction circuit 11 calculates a correction coefficient b of the pixel B inside the pixel unit 31 based on a ratio SigAve/Sig2 (b=SigAve/Sig2) between the pixel average value SigAve and a pixel output value Sig2 of the pixel B. Further, the calculated correction coefficients a and b in each of the pixel units 31 are stored in the memory 12.

When imaging is executed, the correction circuit 11 executes the sensitivity difference correction processing to correct the sensitivity difference by using the correction coefficients stored in the memory 12 by the correction coefficient calculation processing.

Except for that the pixel unit 31 is formed of the two pixels instead of the four pixels, the details of the correction coefficient calculation processing and the sensitivity difference correction processing are same as the processing described with reference to the flowcharts of FIGS. 10, 11 and 13. Therefore, the description therefor will be omitted.

Further, in the case where the pixel unit 31 is formed of the two pixels, correction tables to be stored in the memory 12 may also be the correction table per wavelength or the correction table per color temperature while setting the color array of the color filters 25 as the RGBW array.

As described above, the pixel unit 31 is at least the unit in which one microlens 26 is formed for a plurality of pixels 2, for example, two pixels, four pixel, eight pixels, and so on. However, the boundary between the pixel unit 31 is located so as to coincide with the boundaries between the respective pixels 2 each having the photodiode PD.

<Exemplary Substrate Configuration of Solid-State Imaging Device>

Figure 22:
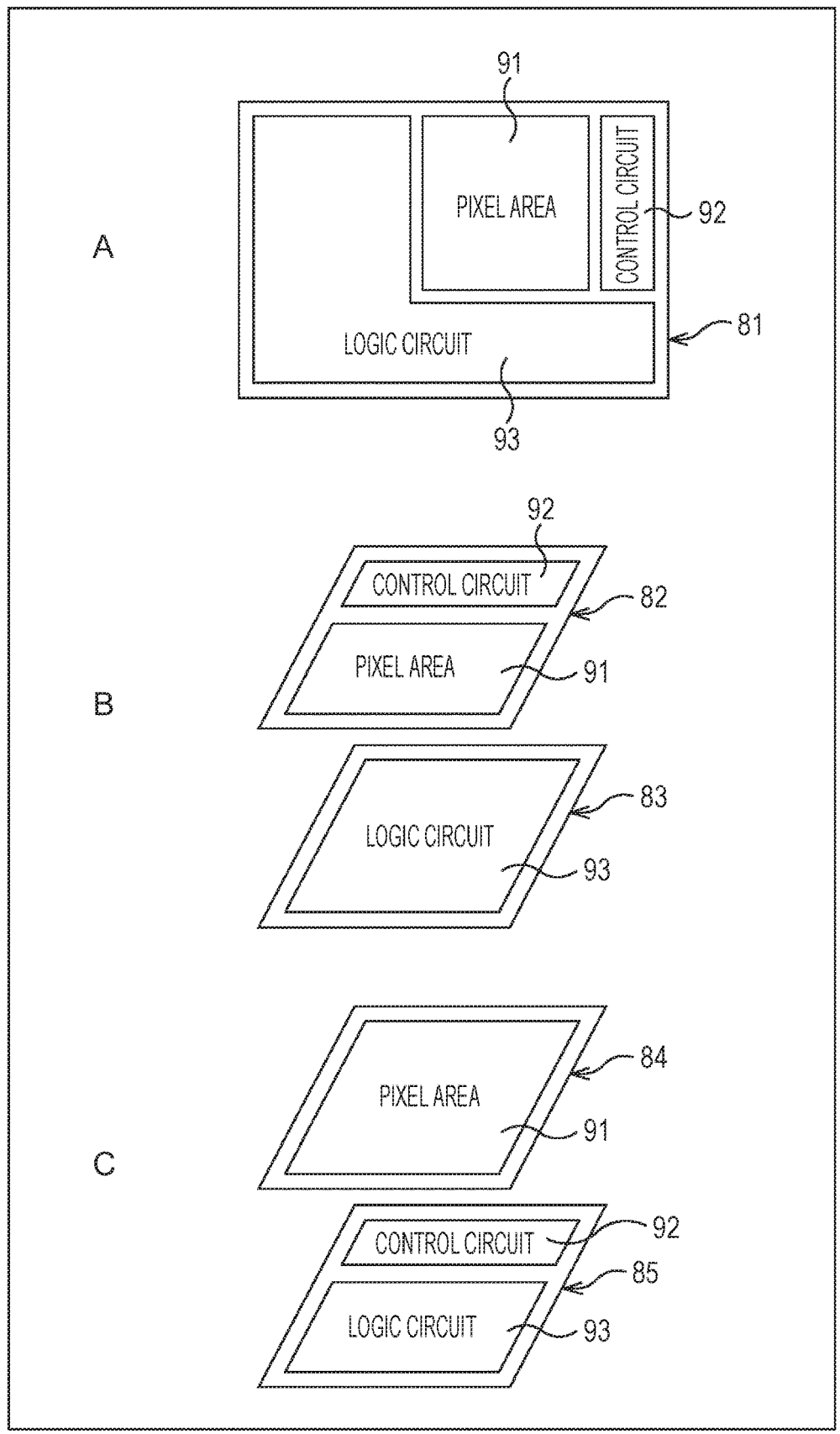
FIG. 22 is an explanatory diagram for exemplary substrate configurations of the solid-state imaging device.

The solid-state imaging device 1 in FIG. 1 can adopt any one of substrate configurations illustrated in diagrams A to C of FIG. 22.

The diagram A in FIG. 22 illustrates an example in which the solid-state imaging device 1 is formed on one semiconductor substrate (silicon substrate) 81. More specifically, the one semiconductor substrate 81 is formed with a pixel area 91 where a plurality of pixels 2 is arranged in a matrix, a control circuit 92 adapted to control the respective pixels 2, and a logic circuit 93 including the signal processing circuit for a pixel signal.

The diagram B in FIG. 22 illustrates an example in which the solid-state imaging device 1 has a stacked structure in which two semiconductor substrates 82 and 83 are stacked.

More specifically, the pixel area 91 and the control circuit 92 are formed on the upper-side semiconductor substrate 82, and the logic circuit 93 is formed on the lower-side semiconductor substrate 83. The semiconductor substrates 82 and 83 are electrically connected via a through-via or by metal binding of Cu—Cu, for example.

The diagram C in FIG. 22 also illustrates an example in which the solid-state imaging device 1 has a stacked structure in which two semiconductor substrates 84 and 85 are stacked. More specifically, only the pixel area 91 is formed on the upper-side semiconductor substrate 84, and the control circuit 92 and the logic circuit 93 are formed on the lower-side semiconductor substrate 85. The semiconductor substrates 84 and 85 are electrically connected via a through-via or by metal binding of Cu—Cu, for example.

2. Second Embodiment

<Exemplary Schematic Configuration of Solid-State Imaging Device>

Figure 23:
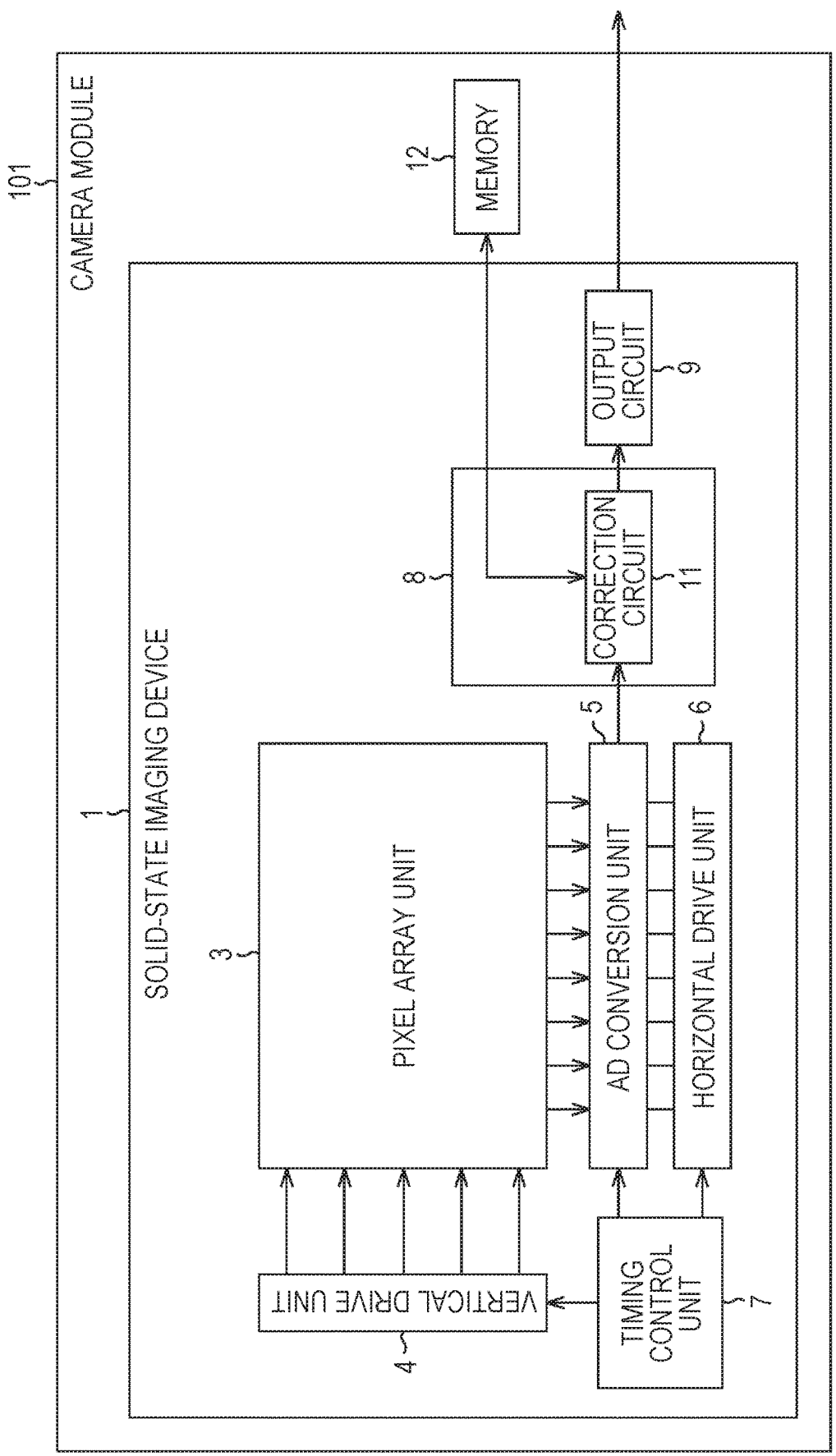
FIG. 23 is a block diagram illustrating a second embodiment of a solid-state imaging device according to the present disclosure.

FIG. 23 is a block diagram illustrating a second embodiment of a solid-state imaging device according to the present disclosure.

In FIG. 23, a portion corresponding to a first embodiment illustrated in FIG. 1 is denoted by a same reference sign, and a description therefor will be appropriately omitted.

A solid-state imaging device 1 according to the second embodiment differs from a solid-state imaging device 1 according to the first embodiment illustrated in FIG. 1 in that a memory 12 is not provided in a signal processing circuit 8. In other words, the signal processing circuit 8 of the solid-state imaging device 1 according to the second embodiment is formed of only a correction circuit 11.

In the second embodiment, the memory 12 to store a correction table is provided at a camera module 101 outside the solid-state imaging device 1. The correction circuit 11 makes the memory 12 store a correction coefficient obtained from correction coefficient calculation processing, and further in the sensitivity difference correction processing, obtains the correction coefficient from the memory 12 of the camera module 101 and calculates a pixel signal subjected to sensitivity difference correction.

3. Third Embodiment

<Exemplary Schematic Structure of Solid-State Imaging Device>

Figure 24:
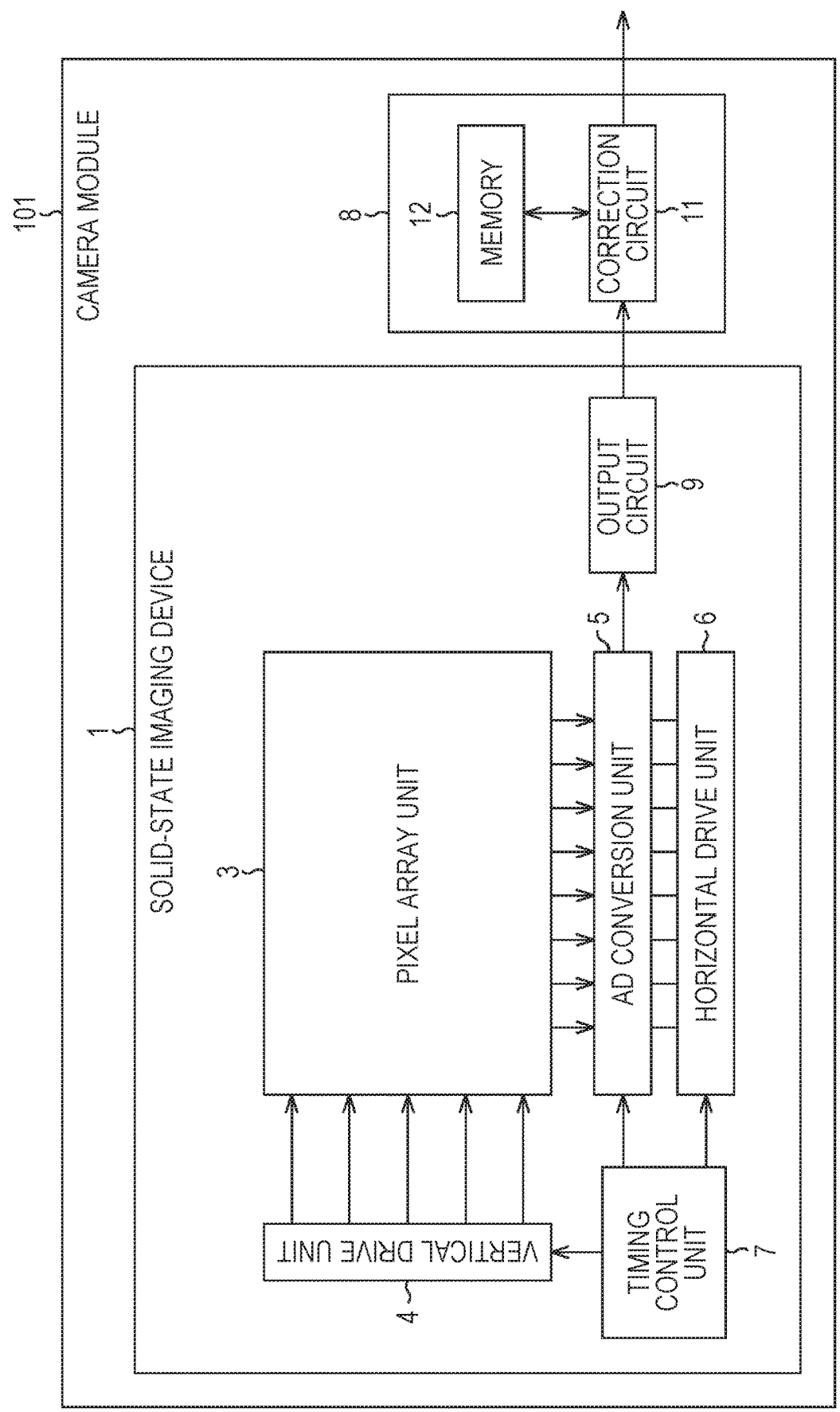
FIG. 24 is a block diagram illustrating a third embodiment of a solid-state imaging device according to the present disclosure.

FIG. 24 is a block diagram illustrating a third embodiment of a solid-state imaging device according to the present disclosure.

In FIG. 24, a portion corresponding to a first embodiment illustrated in FIG. 1 is denoted by a same reference sign, and a description therefor will be appropriately omitted.

A solid-state imaging device 1 according to the third embodiment differs from a solid-state imaging device 1 according to the first embodiment illustrated in FIG. 1 in that a signal processing circuit 8 is not provided. In the third embodiment, the signal processing circuit 8 is provided at a camera module 101 outside the solid-state imaging device 1.

In the third embodiment, a pixel signal having a sensitivity difference not corrected is supplied from an output circuit 9 of the solid-state imaging device 1 to the signal processing circuit 8 of the camera module 101. A correction circuit 11 of the signal processing circuit 8 executes correction coefficient calculation processing and makes a memory 12 store a correction coefficient to correct the sensitivity difference. Further, the correction circuit 11 executes sensitivity difference correction processing in the case where a pixel signal of a captured image is supplied from the solid-state imaging device 1. More specifically, the correction circuit 11 obtains the correction coefficient from the memory 12 of the camera module 101, and applies sensitivity difference correction to the pixel signal from the solid-state imaging device 1, and outputs the pixel signal subjected to sensitivity difference correction to a circuit in a following stage.

As described above, both or one of the correction circuit 11 and the memory 12 can be provided outside the solid-state imaging device 1.

<4. Exemplary Application to Electronic Apparatus>

The above-described solid-state imaging device 1 is applicable to an imaging device such as a digital still camera and a digital video camera, a mobile phone having an imaging function, or various kinds of electronic apparatuses such as an audio player having an imaging function.

Figure 25:
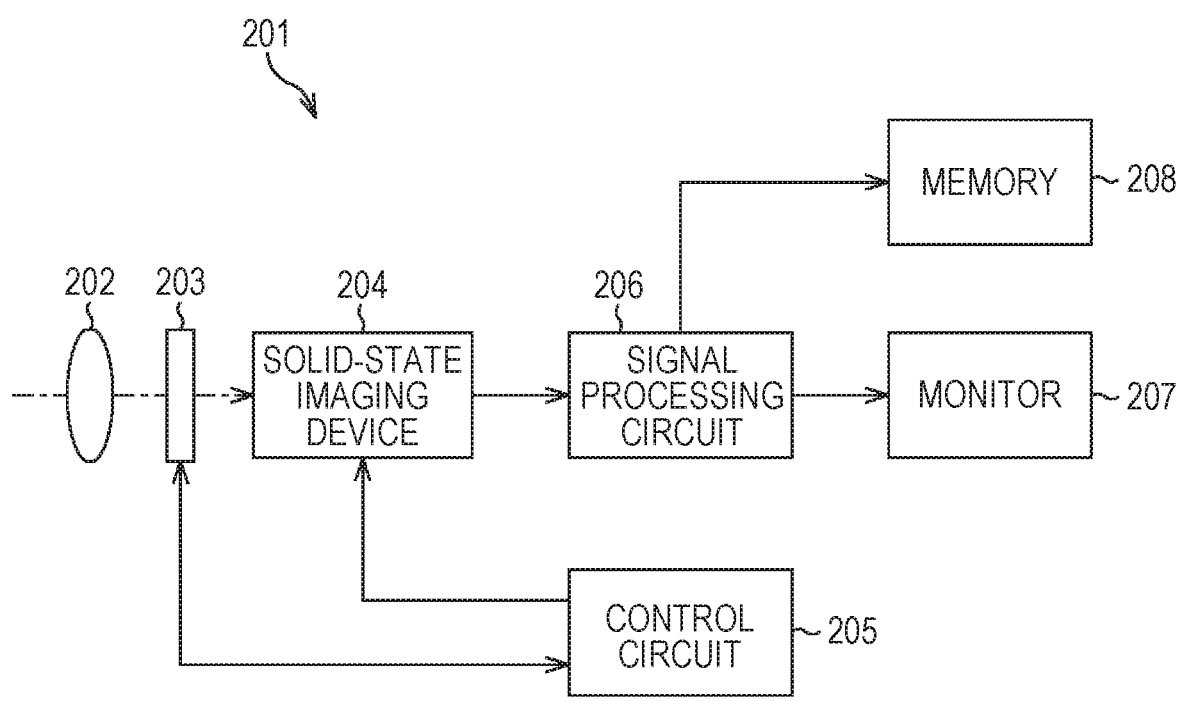
FIG. 25 is a block diagram illustrating an exemplary configuration of an imaging device as an electronic apparatus according to an embodiment of the present disclosure.

FIG. 25 is a block diagram illustrating an exemplary configuration of an imaging device as an electronic apparatus according to an embodiment of the present disclosure.

An imaging device 201 illustrated in FIG. 25 includes an optical system 202, a shutter device 203, a solid-state imaging device 204, a control circuit 205, a signal processing circuit 206, a monitor 207, and a memory 208, and can image a still image and a moving image.

The optical system 202 is formed of one or a plurality of imaging lenses, and guides light (incident light) from an object to the solid-state imaging device 204, and forms an image on a light receiving surface of the solid-state imaging device 204.

The shutter device 203 is disposed between the optical system 202 and the solid-state imaging device 204, and controls a light emitting period and a light shielding period relative the solid-state imaging device 204 in accordance with control of the control circuit 205.

The solid-state imaging device 204 is formed of a solid-state imaging device 1 described above. The solid-state imaging device 204 accumulates signal charge for a predetermined period in accordance with the light with which the image is formed on the light receiving surface via the optical system 202 and the shutter device 203. The signal charge accumulated in the solid-state imaging device 204 is transmitted in accordance with a drive signal (timing signal) supplied from the control circuit 205. The solid-state imaging device 204 may be formed as one chip by itself, and may be formed as a part of a camera module packaged with the optical system 202, the signal processing circuit 206, and the like.

The control circuit 205 outputs a drive signal to control transmitting operation of the solid-state imaging device 204 and shutter operation of the shutter device 203, and drives the solid-state imaging device 204 and the shutter device 203.

The signal processing circuit 206 applies various kinds of signal processing to a pixel signal output from the solid-state imaging device 204. An image (image data) obtained from the signal processing applied by the signal processing circuit 206 is supplied to and displayed on a monitor 207, or supplied to and stored (recorded) in the memory 208.

As described above, by using the solid-state imaging device 1 according to each of the above-described embodiments as the solid-state imaging device 204, it is possible to perform sensitivity correction in which a sensitivity difference between the solid-state imaging devices is suppressed. Therefore, high image quality can be also achieved for a captured image in the imaging device 201 such as a video camera, digital still camera, and also a camera module used in a mobile device like a mobile phone.

The embodiments of the present disclosure are not limited to the above-described embodiments, and various kinds of modifications can be made within a range not departing from a gist of the present disclosure.

In the above-described embodiment, described is the solid-state imaging device in which the first conductive type is set as a p-type, the second conductive type is set as an n-type, and electrons are deemed as the signal charge. However, the present disclosure is also applicable to a solid-state imaging device in which an electron hole is deemed as the signal charge. In other words, each of the above-described semiconductor regions can be formed of a semiconductor region having a reverse conductive type by setting the first conductive type as the n-type and the second conductive type as the p-type.

Further, application of the present disclosure is not limited to a solid-state imaging device that detects distribution of incident light amounts of visible light and captures the distribution as an image. The present disclosure is applicable to a solid-state imaging device that captures distribution of indecent light amounts of infrared, X-ray, particles, or the like as an image, and in a broad sense, applicable to a general solid-state imaging device (physical amount distribution detection device) such as a fingerprint detection sensor that detects distribution of other physical amounts like pressure and electrostatic capacitance and that captures the distribution as an image.

An embodiment optionally combining all or part of the above-described embodiments can be adopted.

Note that the effects recited in the present specification are merely examples and not limited thereto, and effects other than those recited in the present specification may be provided as well.

Further, the present technology can also have the following configurations.

(1)

A solid-state imaging device includes:

a pixel unit in which one microlens is formed for a plurality of pixels in a manner such that a boundary of the microlens coincides with boundaries of the pixels; and a correction circuit that adapted to correct a sensitivity difference between pixels inside the pixel unit based on a correction coefficient.

(2)

The solid-state imaging device according to above (1), wherein the correction coefficient is calculated based on an added signal obtained by adding pixel signals of the respective pixels of the pixel unit.

(3)

The solid-state imaging device according to above (2), wherein the pixel unit includes an adding unit configured to generate the added signal.

(4)

The solid-state imaging device according to above (3), wherein the adding unit is an FD shared by respective pixels of the pixel unit.

(5)

The solid-state imaging device according to any one of above (2) to (4), wherein the correction coefficient is calculated based on a pixel average value obtained by dividing the added signal by the number of pixels of the pixel unit.

(6)

The solid-state imaging device according to above (5), wherein the correction coefficient is calculated by a ratio between the pixel average value and a pixel signal of each of the pixels of the pixel unit.

(7)

The solid-state imaging device according to above (2), wherein the correction circuit also performs adding processing in which the added signal is calculated by adding pixel signals of respective pixels of the pixel unit.

(8)

The solid-state imaging device according to any one of above (1) to (7), further including a memory adapted to store the correction coefficient, wherein the correction circuit performs correction based on the correction coefficient obtained from the memory.

(9)

The solid-state imaging device according to any one of above (1) to (8), wherein a plurality of the pixel units is arranged inside a pixel array unit in which the pixels are two-dimensionally arrayed in a matrix, and the correction coefficient is provided for each of pixels constituting the pixel unit.

(10)

The solid-state imaging device according to any one of above (1) to (9), wherein
a plurality of the pixel units is arranged inside a pixel array unit in which the pixels are two-dimensionally arrayed in a matrix, and
the correction coefficient is provided for each of regions obtained by dividing the pixel array unit into predetermined number.

(11)

The solid-state imaging device according to any one of above (1) to (10), wherein the correction coefficient is provided per wavelength of light received by the pixel.

(12)

The solid-state imaging device according to any one of above (1) to (11), wherein the correction coefficient is provided per color temperature of light received by the pixel.

(13)

The solid-state imaging device according to above (12), wherein the correction circuit uses a pixel signal of another pixel to estimate a color temperature of light received by the pixel, and performs correction based on the correction coefficient corresponding to the estimated color temperature.

(14)

The solid-state imaging device according to above (13), wherein the pixel from which a color temperature of light is estimated is a white pixel formed with a white color filter.

(15)

The solid-state imaging device according to any one of above (1) to (14), wherein the solid-state imaging device is a back-illumination type.

(16)

The solid-state imaging device according to any one of above (1) to (15), having a stacked structure in which a plurality of semiconductor substrates is stacked.

(17)

A signal processing method in a solid-state imaging device, wherein the solid-state imaging device includes a pixel unit in which one microlens is formed for a plurality of pixels in a manner such that a boundary of the microlens coincides with boundaries of the pixels, and a correction circuit of the solid-state imaging device corrects a sensitivity difference between pixels inside the pixel unit based on a correction coefficient.

(18)

An electronic apparatus provided with a solid-state imaging device that includes:
a pixel unit in which one microlens is formed for a plurality of pixels in a manner such that a boundary of the microlens coincides with boundaries of the pixels; and
a correction circuit adapted to correct a sensitivity difference between pixels inside the pixel unit based on a correction coefficient.

REFERENCE SIGNS LIST

1 Solid-state imaging device
2 Pixel
3 Pixel array unit
8 Signal processing circuit
11 Correction circuit
12 Memory
31 Pixel unit
25 Color filter
26 Microlens
PD Photodiode
81 to 85 Semiconductor substrate
201 Imaging device
204 Solid-state imaging device

The invention claimed is:

1. An imaging device comprising:
a pixel array including first and second pixel units,
each of the first and second pixel units including:
a photoelectric region having first and second pixels that respectively include first and second N-type semiconductor regions divided by a P-type semiconductor region;
a microlens disposed on a light incident side of the photoelectric region; and
a color filter disposed between the photoelectric region and the microlens,
wherein the pixel array includes a light shielding material disposed adjacent to a boundary between the color filter of the first pixel unit and the color filter of the second pixel unit in a cross-section view,
wherein the first and second N-type semiconductor regions of the first and second pixels in each pixel unit are configured to generate first and second image signals corresponding to incident light,
wherein the first and second image signals generated by the first and second N-type semiconductor regions in each pixel unit are corrected based on a first and second correction coefficient, and wherein the first correction coefficient is calculated by a ratio between a pixel average value for the first pixel unit and the first image signal and the second correction coefficient is calculated based on a ratio between a pixel average for the second pixel unit and the second image signal.

2. The imaging device of claim 1, wherein the pixels of the pixel units have a rectangular shape in a plan view, and wherein the pixel units have a square shape in the plan view.

3. The imaging device of claim 2, wherein the microlens of each pixel unit is arranged within the square shape of the respective pixel unit in the plan view.

4. The imaging device of claim 3, wherein a long side of the rectangular shape of each of the pixels of the pixel units are oriented such that it is parallel to a vertical direction.

5. The imaging device of claim 3, wherein a color of the color filter of the first pixel unit is different than a color of the color filter of the second pixel unit.

6. The imaging device of claim 5, wherein the pixel array further includes third and fourth pixel units, wherein the first, second, third, and fourth pixel units are adjacent to one another and form a 2×2 matrix.

7. The imaging device of claim 6, wherein an area of the 2×2 matrix is square.

8. The imaging device of claim 6, wherein one of the third and fourth pixel units has a color filter with a color that is the same as a color of the color filter of one of the first and second pixel units.

9. The imaging device of claim 8, wherein the first, second, third, and fourth pixel units form a Bayer array.

10. The imaging device of claim 1, wherein the microlens is symmetrical.

11. The imaging device of claim 1, wherein the light shielding material is disposed on a light incident surface of a semiconductor substrate in which the N-type and P-type semiconductor regions are formed.

12. The imaging device of claim 11, further comprising an oxide film, wherein the oxide film is between the light incident surface of the semiconductor substrate and each color filter.

13. The imaging device of claim 1, further comprising:
a signal processing circuit, the signal processing circuit including:
a correction circuit; and
a memory, wherein each respective correction coefficient is calculated for each pixel, wherein the memory stores the calculated correction coefficients, and wherein the correction circuit executes sensitivity difference correction processing to correct sensitivity difference between pixels based on the correction coefficients for the respective pixels.

14. The imaging device of claim 1, wherein the corrected first and second image signals are applied for phase difference detection.

15. An electronic apparatus comprising:
an imaging device, the imaging device including:
a pixel array including a plurality of pixel units, each pixel unit including a plurality of pixels;
a plurality of color filters, wherein each pixel unit includes one of the plurality of color filters;
a plurality of microlenses, wherein each pixel unit includes one of the plurality of microlenses;
a light shielding film, wherein the light shielding film is disposed between adjacent pixel units;
a correction circuit, wherein the correction circuit calculates a correction coefficient for each pixel of the plurality of pixels, wherein each respective correction coefficient is calculated by a ratio between a pixel average value for each pixel unit and a signal image signal for each pixel in the pixel unit.

16. The electronic apparatus of claim 15, further comprising:
a memory, wherein correction coefficients for each pixel is stored in the memory.

17. The electronic apparatus of claim 16, wherein each pixel unit includes two pixels.

18. The electronic apparatus of claim 17, wherein the two pixels of any one pixel unit have a rectangular light incident area.

19. The electronic apparatus of claim 18, wherein the pixel units have a square light incident area.

20. The electronic apparatus of claim 19, wherein a color of one of the plurality of color filters of any one pixel unit is different than a color of a color filter of an adjacent pixel unit.

* * * * *